(12) United States Patent
Sudo

(10) Patent No.: US 8,658,504 B2
(45) Date of Patent: Feb. 25, 2014

(54) METHOD FOR MANUFACTURING SEMICONDUCTOR DEVICE

(75) Inventor: Gaku Sudo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 72 days.

(21) Appl. No.: 13/417,524

(22) Filed: Mar. 12, 2012

(65) Prior Publication Data

US 2013/0059401 A1 Mar. 7, 2013

(30) Foreign Application Priority Data

Sep. 1, 2011 (JP) .................................. 2011-191048

(51) Int. Cl.
*H01L 21/336* (2006.01)

(52) U.S. Cl.
USPC ................... 438/294; 438/300; 257/E21.619

(58) Field of Classification Search
USPC ................. 438/294, 285, 300; 257/E21.619, 257/E21.634
See application file for complete search history.

(56) References Cited

U.S. PATENT DOCUMENTS

| | | | | |
|---|---|---|---|---|
| 6,815,738 B2 * | 11/2004 | Rim | .............................. | 257/256 |
| 6,855,582 B1 * | 2/2005 | Dakshina-Murthy et al. | .............. | 438/157 |
| 6,936,516 B1 * | 8/2005 | Goo et al. | ....................... | 438/283 |
| 7,078,299 B2 * | 7/2006 | Maszara et al. | ............... | 438/285 |
| 7,105,390 B2 * | 9/2006 | Brask et al. | .................... | 438/149 |
| 7,161,206 B2 * | 1/2007 | Oh et al. | ......................... | 257/316 |
| 7,300,837 B2 * | 11/2007 | Chen et al. | .................... | 438/213 |
| 7,323,375 B2 * | 1/2008 | Yoon et al. | .................... | 438/164 |
| 7,326,656 B2 * | 2/2008 | Brask et al. | .................... | 438/785 |
| 7,329,913 B2 * | 2/2008 | Brask et al. | .................... | 257/287 |
| 7,402,493 B2 * | 7/2008 | Oh et al. | ......................... | 438/257 |
| 7,420,244 B2 * | 9/2008 | Yoon et al. | .................... | 257/328 |
| 7,528,025 B2 * | 5/2009 | Brask et al. | .................... | 438/183 |
| 7,544,994 B2 * | 6/2009 | Schepis et al. | ................ | 257/327 |
| 7,556,992 B2 * | 7/2009 | Shi et al. | ........................ | 438/164 |
| 7,745,290 B2 * | 6/2010 | Seo et al. | ....................... | 438/270 |
| 7,772,048 B2 * | 8/2010 | Jones et al. | .................... | 438/142 |
| 7,781,273 B2 * | 8/2010 | Schepis et al. | ................ | 438/157 |
| 7,824,983 B2 * | 11/2010 | Juengling | ...................... | 438/270 |
| 7,851,340 B2 * | 12/2010 | Brownson et al. | ............ | 438/585 |
| 7,902,057 B2 * | 3/2011 | McDaniel | ..................... | 438/589 |
| 7,902,584 B2 * | 3/2011 | Nakajima | ...................... | 257/308 |
| 7,939,407 B2 * | 5/2011 | Purayath et al. | .............. | 438/257 |
| 7,968,930 B2 * | 6/2011 | Aritome | ........................ | 257/314 |

(Continued)

FOREIGN PATENT DOCUMENTS

JP 2011-9296 1/2011

OTHER PUBLICATIONS

Yang, Fu-Liang et al., "35nm CMOS FinFETs", IEEE 200 Symposium on VLSI Technology Digest of Technical Papers, 2 pages, (Jun. 11, 2002).

*Primary Examiner* — Mary Wilczewski
(74) *Attorney, Agent, or Firm* — Finnegan, Henderson, Farabow, Garrett & Dunner, L.L.P.

(57) ABSTRACT

According to one embodiment, a method for manufacturing a semiconductor device includes forming a depression in an upper portion of a semiconductor substrate, placing a sacrificial material in the depression, forming a plurality of fins extending in one direction and arranged periodically by selectively removing the semiconductor substrate and the sacrificial material, forming a device isolation insulating film in a lower portion of space between the fins, removing the sacrificial material, forming a gate insulating film on an exposed surface of the fin, and forming a gate electrode. The gate electrode extends in a direction crossing the one direction so as to straddle the fin on the device isolation insulating film.

15 Claims, 25 Drawing Sheets

(56) References Cited

U.S. PATENT DOCUMENTS

| | | | |
|---|---|---|---|
| 8,134,209 B2* | 3/2012 | Yagishita et al. | 257/347 |
| 8,148,775 B2* | 4/2012 | Gilgen et al. | 257/330 |
| 8,163,610 B2* | 4/2012 | Aritome | 438/211 |
| 8,263,459 B2* | 9/2012 | Blomme | 438/265 |
| 8,294,511 B2* | 10/2012 | Juengling | 327/566 |
| 8,334,184 B2* | 12/2012 | Steigerwald et al. | 438/294 |
| 8,395,195 B2* | 3/2013 | Chang et al. | 257/255 |
| 8,445,387 B2* | 5/2013 | Wells et al. | 438/700 |
| 8,486,819 B2* | 7/2013 | Kim | 438/589 |
| 8,497,177 B1* | 7/2013 | Chang et al. | 438/283 |
| 8,541,286 B2* | 9/2013 | Park | 438/427 |
| 2004/0169239 A1* | 9/2004 | Rim | 257/411 |
| 2005/0077553 A1* | 4/2005 | Kim et al. | 257/288 |
| 2005/0242395 A1* | 11/2005 | Chen et al. | 257/347 |
| 2005/0250285 A1* | 11/2005 | Yoon et al. | 438/283 |
| 2008/0206933 A1* | 8/2008 | Brownson et al. | 438/151 |
| 2008/0206934 A1* | 8/2008 | Jones et al. | 438/151 |
| 2011/0143528 A1* | 6/2011 | Juengling | 438/589 |
| 2012/0276712 A1* | 11/2012 | Ikeda et al. | 438/424 |
| 2012/0302052 A1* | 11/2012 | Mariani et al. | 438/586 |
| 2013/0001591 A1* | 1/2013 | Wu et al. | 257/77 |
| 2013/0059401 A1* | 3/2013 | Sudo | 438/3 |
| 2013/0119370 A1* | 5/2013 | Wu et al. | 257/43 |
| 2013/0122685 A1* | 5/2013 | Kim | 438/424 |
| 2013/0134513 A1* | 5/2013 | Standaert et al. | 257/347 |
| 2013/0224945 A1* | 8/2013 | Liu et al. | 438/595 |

* cited by examiner

A-A'

B-B'

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2011-191048, filed on Sep. 1, 2011; the entire contents of which are incorporated herein by reference.

FIELD

Embodiments described herein relate generally to a method for manufacturing semiconductor device.

BACKGROUND

Recently, in order to achieve compatibility between increased integration density and increased on-current in a MOSFET (metal-oxide-semiconductor field-effect transistor), a fin type MOSFET (hereinafter referred to as "FinFET") has been proposed. In a FinFET, a projected fin extending in one direction is formed on the upper surface of a semiconductor substrate. A gate electrode extending in another direction is provided so as to straddle this fin. Hence, the outer periphery of the portion of the fin surrounded with the gate electrode constitutes a channel region. Thus, the channel width can be expanded without increasing the device area.

However, with the downsizing of the FinFET, it is difficult to uniformly form a large number of FinFETs.

BRIEF DESCRIPTION OF THE DRAWINGS

FIG. 1A is a plan view, FIG. 1B is a sectional view taken along line A-A' shown in FIG. 1A, and FIG. 1C is a sectional view taken along line B-B' shown in FIG. 1A;

FIG. 2A is a plan view, FIG. 2B is a sectional view taken along line A-A' shown in FIG. 2A, and FIG. 2C is a sectional view taken along line B-B' shown in FIG. 2A;

FIG. 3A is a plan view, FIG. 3B is a sectional view taken along line A-A' shown in FIG. 3A, and FIG. 3C is a sectional view taken along line B-B' shown in FIG. 3A;

FIG. 4A is a plan view, FIG. 4B is a sectional view taken along line A-A' shown in FIG. 4A, and FIG. 4C is a sectional view taken along line B-B' shown in FIG. 4A;

FIG. 5A is a plan view, FIG. 5B is a sectional view taken along line A-A' shown in FIG. 5A, and FIG. 5C is a sectional view taken along line B-B' shown in FIG. 5A;

FIG. 6A is a plan view, FIG. 6B is a sectional view taken along line A-A' shown in FIG. 6A, and FIG. 6C is a sectional view taken along line B-B' shown in FIG. 6A;

FIG. 7A is a plan view, FIG. 7B is a sectional view taken along line A-A' shown in FIG. 7A, and FIG. 7C is a sectional view taken along line B-B' shown in FIG. 7A;

FIG. 8A is a plan view, FIG. 8B is a sectional view taken along line A-A' shown in FIG. 8A, and FIG. 8C is a sectional view taken along line B-B' shown in FIG. 8A;

FIG. 9A is a plan view, FIG. 9B is a sectional view taken along line A-A' shown in FIG. 9A, and FIG. 9C is a sectional view taken along line B-B' shown in FIG. 9A;

FIG. 10A is a plan view, FIG. 10B is a sectional view taken along line A-A' shown in FIG. 10A, and FIG. 10C is a sectional view taken along line B-B' shown in FIG. 10A;

FIG. 11A is a plan view, FIG. 11B is a sectional view taken along line A-A' shown in FIG. 11A, and FIG. 11C is a sectional view taken along line B-B' shown in FIG. 11A;

FIG. 13A is a plan, and FIG. 13B is a sectional view taken along line C-C' shown in FIG. 13A;

FIG. 14A is a plan view, FIG. 14B is a sectional view taken along line C-C' shown in FIG. 14A, and FIG. 14C is a sectional view taken along line D-D' shown in FIG. 14A;

FIG. 15A is a plan view, FIG. 15B is a sectional view taken along line A-A' shown in FIG. 15A, and FIG. 15C is a sectional view taken along line B-B' shown in FIG. 15A;

FIG. 16A is a plan view, FIG. 16B is a sectional view taken along line A-A' shown in FIG. 16A, and FIG. 16C is a sectional view taken along line B-B' shown in FIG. 16A;

FIG. 17A is a plan view, FIG. 17B is a sectional view taken along line A-A' shown in FIG. 17A, and FIG. 17C is a sectional view taken along line B-B' shown in FIG. 17A;

FIG. 18A is a plan view, FIG.

18B is a sectional view taken along line A-A' shown in FIG. 18A, and FIG. 18C is a sectional view taken along line B-B' shown in FIG. 18A;

FIG. 19A is a plan view, FIG. 19B is a sectional view taken along line A-A' shown in FIG. 19A, and FIG. 19C is a sectional view taken along line B-B' shown in FIG. 19A;

FIG. 20A is a plan view, FIG. 20B is a sectional view taken along line A-A' shown in FIG. 20A, and FIG. 20C is a sectional view taken along line B-B' shown in FIG. 20A;

FIG. 21A is a plan view, FIG. 21B is a sectional view taken along line A-A' shown in FIG. 21A, and FIG. 21C is a sectional view taken along line B-B' shown in FIG. 21A;

FIG. 22A is a plan view, FIG. 22B is a sectional view taken along line A-A' shown in FIG. 22A, and FIG. 22C is a sectional view taken along line B-B' shown in FIG. 22A;

FIG. 23A is a plan view, FIG. 23B is a sectional view taken along line A-A' shown in FIG. 23A, and FIG. 23C is a sectional view taken along line B-B' shown in FIG. 23A;

FIG. 24A is a plan view, FIG. 24B is a sectional view taken along line A-A' shown in FIG. 24A, and FIG. 24C is a sectional view taken along line B-B' shown in FIG. 24A; FIG. 25A is a plan view, FIG. 25B is a sectional view taken along line A-A' shown in FIG. 25A, and FIG. 25C is a sectional view taken along line B-B' shown in FIG. 25A.

DETAILED DESCRIPTION

Figure 1A:
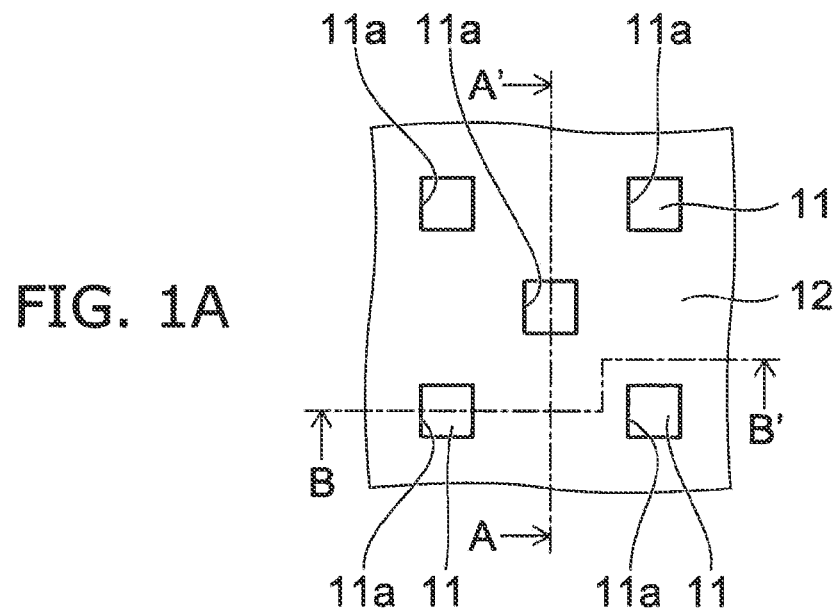
FIGS. 1A to 1C are process views illustrating a method for manufacturing a semiconductor device according to a first embodiment, where

According to one embodiment, a method for manufacturing a semiconductor device includes forming a depression in an upper portion of a semiconductor substrate, placing a sacrificial material in the depression, forming a plurality of fins extending in one direction and arranged periodically by selectively removing the semiconductor substrate and the sacrificial material, forming a device isolation insulating film in a lower portion of space between the fins, removing the sacrificial material, forming a gate insulating film on an exposed surface of the fin, and forming a gate electrode. The gate electrode extends in a direction crossing the one direction so as to straddle the fin on the device isolation insulating film.

According to another embodiment, a method for manufacturing a semiconductor device includes, forming a depression in an upper portion of a semiconductor substrate, forming a barrier film on an inner surface of the depression, placing a sacrificial material in the depression, forming a plurality of fins extending in one direction and arranged periodically by selectively removing the semiconductor substrate, the barrier film, and the sacrificial material, forming a device isolation insulating film in a lower portion of space between the fins, removing the sacrificial material by etching using the barrier film as a stopper, forming a gate insulating film on an exposed surface of the fin, and forming a gate electrode extending in a direction crossing the one direction so as to straddle the fin on the device isolation insulating film.

According to another embodiment, a method for manufacturing a semiconductor device includes, forming a depression in an upper portion of a semiconductor substrate, placing a sacrificial material in the depression, forming a plurality of fins extending in one direction and arranged periodically by selectively removing the semiconductor substrate and the sacrificial material, forming a device isolation insulating film in a lower portion of space between the fins, forming a gate insulating film on an exposed surface of the fin, forming a first conductive film so as to cover the fin on the device isolation insulating film, exposing the sacrificial material at an upper surface of the first conductive film, removing the sacrificial material, forming a second conductive film on the first conductive film, and forming a gate electrode extending in a direction crossing the one direction by selectively removing the second conductive film and the first conductive film.

According to another embodiment, a method for manufacturing a semiconductor device includes, stacking a first film made of a first material, a second film made of a second material different from the first material, and a third film made of a third material different from the second material in this order on a semiconductor substrate, forming a stacked body by selectively removing the third film, the second film, the first film, and the semiconductor substrate, forming a sidewall made of a material different from any of the first material, the second material, and the third material on a side surface of the stacked body, removing the third film, and removing the sidewall.

Embodiments of the invention will now be described with reference to the drawings.

First, a first embodiment is described.

FIGS. 1A to 11C are process views illustrating a method for manufacturing a semiconductor device according to the embodiment. Each figure with suffix A is a plan view. Each figure with suffix B is a sectional view taken along line A-A' shown in the corresponding figure with suffix A. Each figure with suffix C is a sectional view taken along line B-B' shown in the corresponding figure with suffix A.

The semiconductor device according to the embodiment is e.g. a memory device, and more particularly an MRAM (magnetoresistive random access memory). In an MRAM, a plurality of memory cells are arrayed. Each memory cell includes a magnetoresistive memory element and a transistor. In the embodiment, the transistor constituting each memory cell is a FinFET.

Figure 1B:
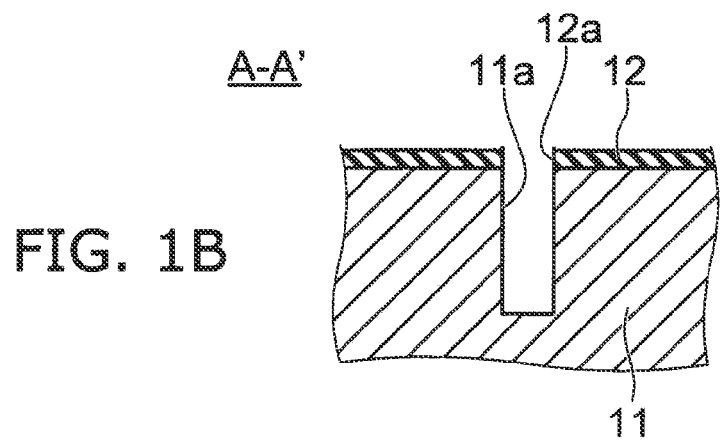
Figure 1C:
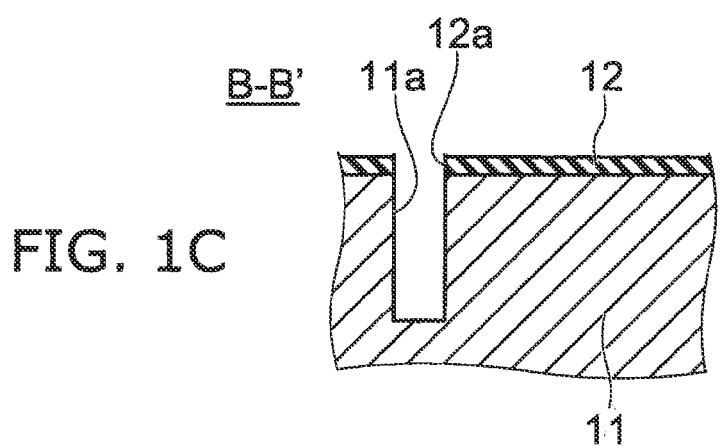

First, as shown in FIGS. 1A to 1C, a silicon substrate 11 is prepared. At least an upper portion of the silicon substrate 11 is a semiconductor doped with impurity. On the silicon substrate 11, a silicon nitride film 12 is formed. Next, by e.g. the photolithography method, a mask film (not shown) is formed on the silicon nitride film 12. This mask film is used as a mask to perform anisotropic etching such as RIE (reactive ion etching). Thus, an opening 12a is formed in the silicon nitride film 12, and a depression 11a is formed in an upper portion of the silicon substrate 11. The depression 11a is formed to a thickness such that the devices formed on the silicon substrate 11 can be separated from each other.

Figure 2A:
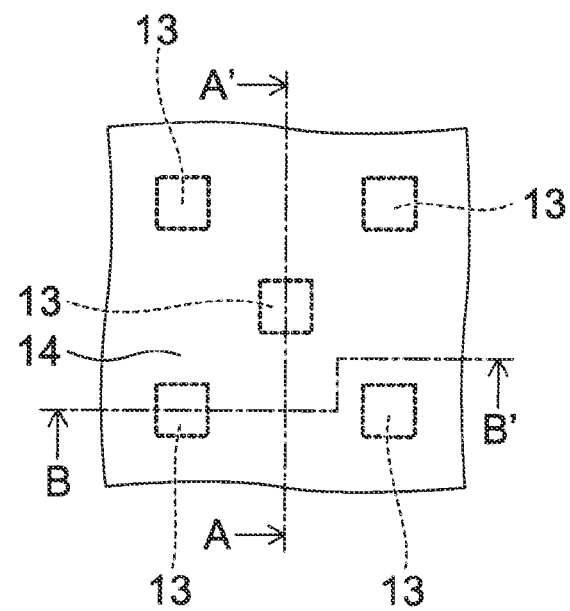
FIGS. 2A to 2C are process views illustrating a method for manufacturing a semiconductor device according to a first embodiment, where
Figure 2B:
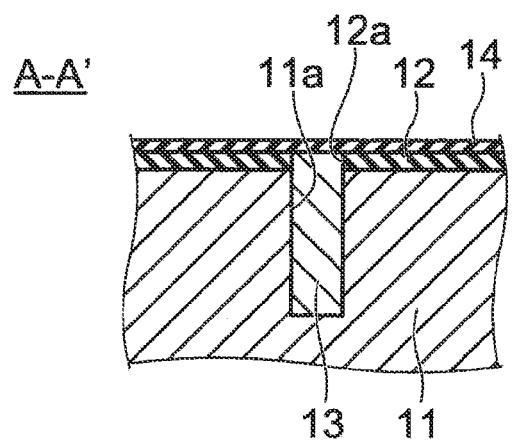
Figure 2C:
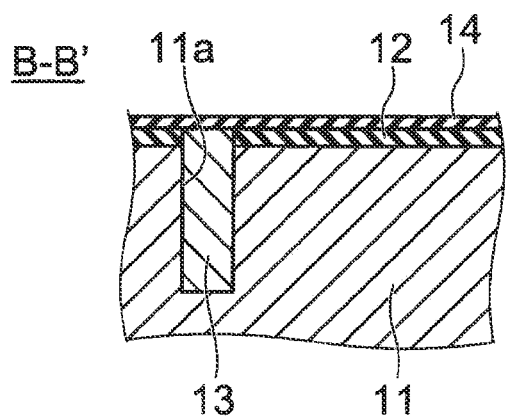

Next, as shown in FIGS. 2A to 2C, by e.g. the selective epitaxial growth method, a silicon germanium (SiGe) member 13 is formed. At this time, the germanium concentration in the silicon germanium member 13 is set to approximately 20-50% in atoms. The silicon nitride film 12 is used as a stopper to perform planarization treatment such as CMP (chemical mechanical polishing) after the film formation, or the film thickness is controlled during the film formation, so that the silicon germanium member 13 is not projected from the upper surface of the silicon nitride film 12. Thus, the silicon germanium member 13 is placed as a sacrificial material in the depression 11a and in the opening 12a. Next, by performing e.g. plasma oxidation treatment, a silicon oxide film 14 is formed on the silicon nitride film 12 and the silicon germanium member 13.

Figure 3A:
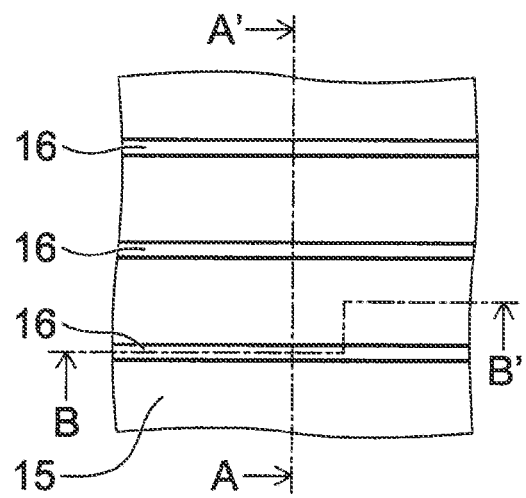
FIGS. 3A to 3C are process views illustrating a method for manufacturing a semiconductor device according to a first embodiment, where
Figure 3B:
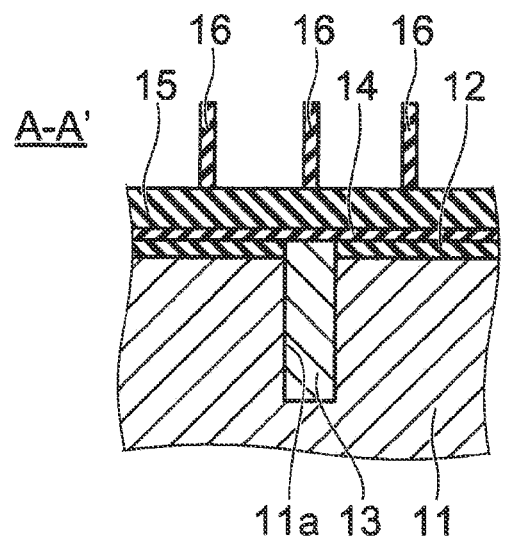
Figure 3C:
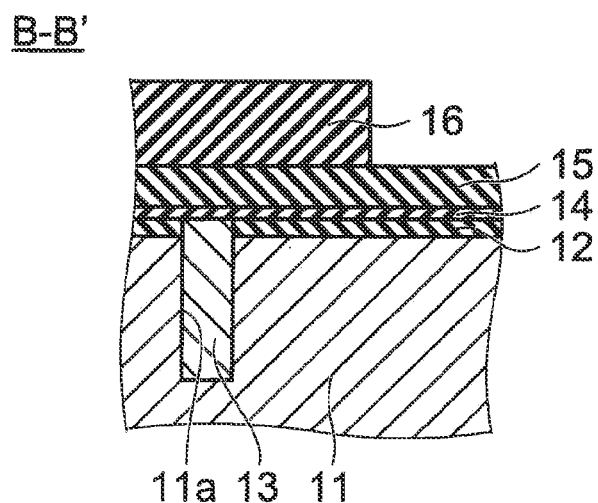

Next, as shown in FIGS. 3A to 3C, a silicon nitride film 15 is formed on the silicon oxide film 14. Next, on the silicon nitride film 15, a hard mask film made of e.g. silicon oxide is formed and patterned into a hard mask 16 by using e.g. the sidewall method. The hard mask 16 is formed as a plurality of line-shaped members extending in one direction and arranged periodically.

Figure 4A:
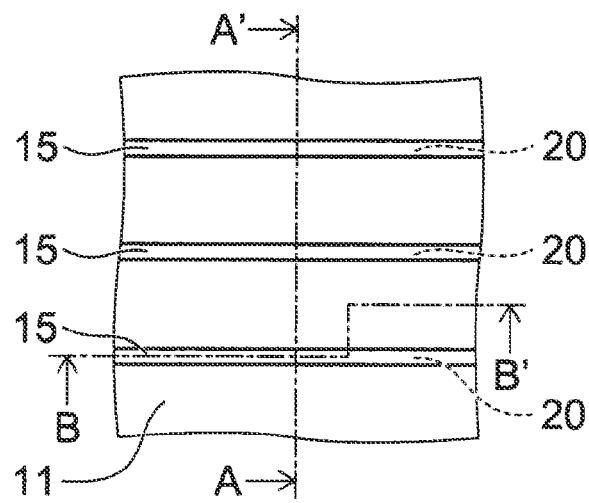
FIGS. 4A to 4C are process views illustrating a method for manufacturing a semiconductor device according to a first embodiment, where
Figure 4B:
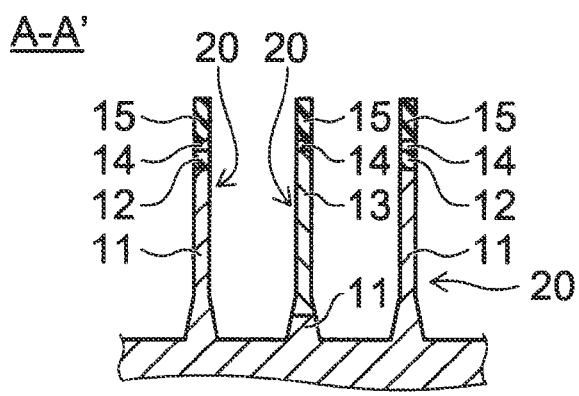
Figure 4C:
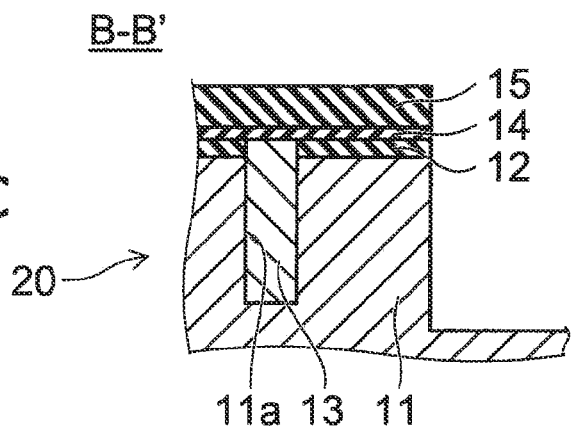

Next, as shown in FIGS. 4A to 4C, the hard mask 16 is used as a mask to perform etching. Thus, the silicon nitride film 15, the silicon oxide film 14, the silicon nitride film 12, an upper portion of the silicon substrate 11, and the silicon germanium member 13 are selectively removed and patterned. Hence, the pattern of the hard mask 16 is transferred to these members. Thus, a plurality of fins 20 extending in one direction and arranged periodically are formed. Each fin 20 has a generally plate-like shape having a major surface perpendicular to the upper surface of the silicon substrate 11. However, the side surface of the root portion of the fin 20 is sloped with respect to the vertical direction. The width of the root portion is expanded downward in a tapered shape.

The fin 20 is largely constituted by the upper portion of the silicon substrate 11, whereas part of the fin 20 is constituted by the silicon germanium member 13. However, the silicon germanium member 13 can be etched almost similarly to the silicon substrate 11. Hence, the distance between the adjacent fins 20 is made nearly uniform. As a result, the microloading effect is suppressed, and the fins 20 can be processed into a uniform shape.

Figure 5A:
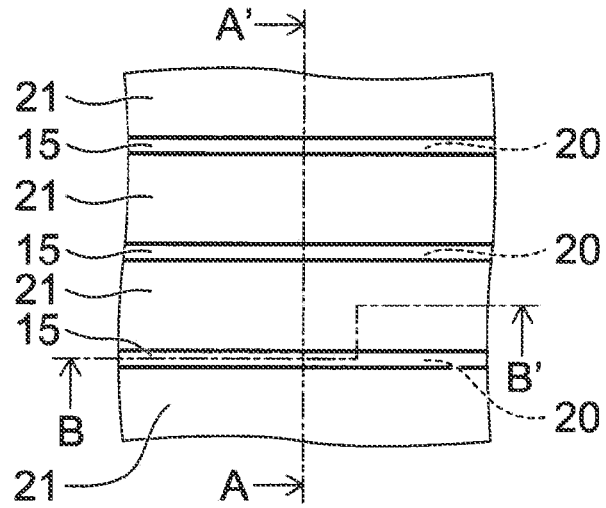
FIGS. 5A to 5C are process views illustrating a method for manufacturing a semiconductor device according to a first embodiment, where
Figure 5B:
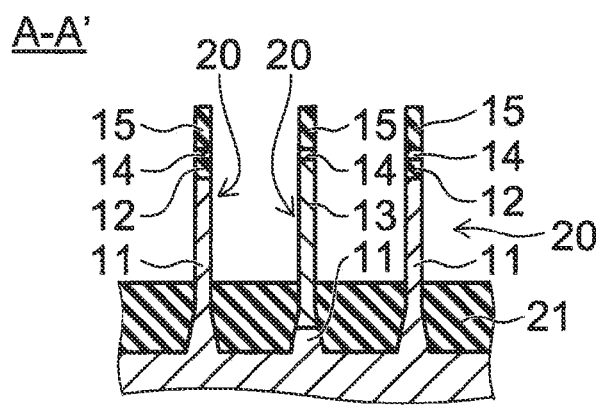
Figure 5C:
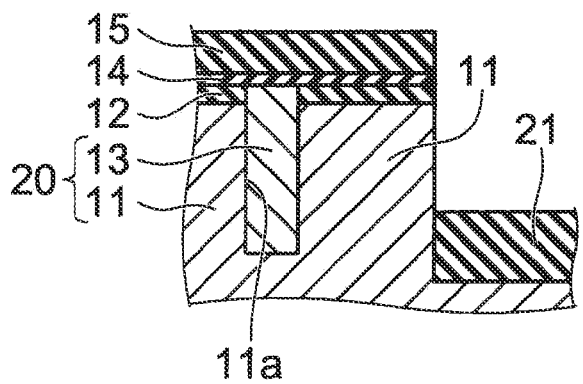

Next, as shown in FIGS. 5A to 5C, by e.g. the coating method, silicon oxide is deposited and heated to form a device isolation insulating film 21 so as to cover the fin 20. At this time, the device isolation insulating film 21 is densified by heating. Furthermore, the device isolation insulating film 21 is densified also by heat treatment in the subsequent process. The device isolation insulating film 21 is partitioned into a plurality of regions by the fins 20. The degree of densification depends on the size of each region. Because the fins 20 are periodically arranged, the size of the partitioned regions of the device isolation insulating film 21 is also equal to each other. Thus, the degree of densification is uniform among the regions, and the composition of the device isolation insulating film 21 is also made uniform. Next, the silicon nitride film 15 is used as a stopper to perform CMP.

Next, by wet etching with an etching liquid containing hydrogen fluoride (HF), the upper surface of the device isolation insulating film 21 is set back. Thus, the device isolation insulating film 21 is formed in a lower portion of the space between the fins 20. At this time, if the composition of the device isolation insulating film 21 is uniform, the degree of etching is also made uniform. Thus, the upper surface is made flat. Here, the upper portion of the device isolation insulating film 21 may be removed by combining RIE with wet etching based on hydrogen fluoride (HF). Furthermore, the device isolation insulating film 21 may be deposited by the CVD (chemical vapor deposition) method.

Figure 6A:
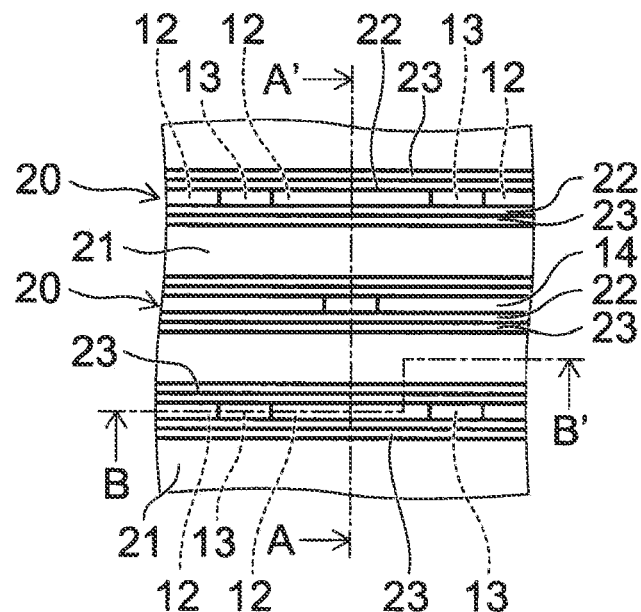
FIGS. 6A to 6C are process views illustrating a method for manufacturing a semiconductor device according to a first embodiment, where
Figure 6B:
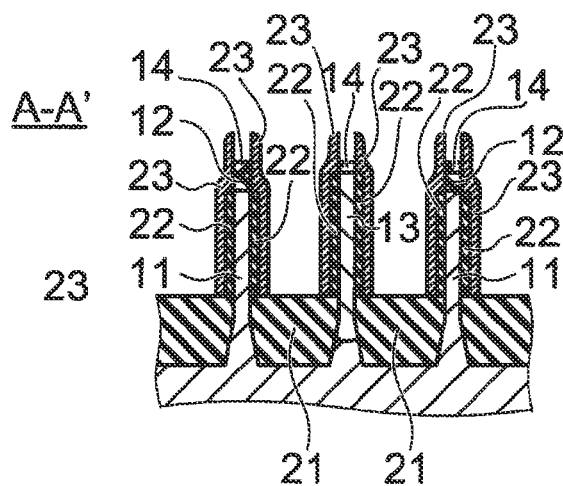
Figure 6C:
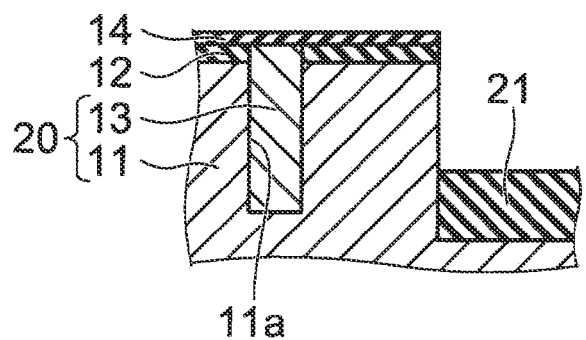

Next, as shown in FIGS. 6A to 6C, oxidation treatment is performed. Thus, on the side surface of the portion of the fin 20 projected from the upper surface of the device isolation insulating film 21, a silicon oxide film 22 is formed as a protective film. Next, by e.g. the LPCVD (low pressure chemical vapor deposition) method or PECVD (plasma enhanced CVD) method, an amorphous silicon film not doped with impurity is formed on the entire surface. By etching back this amorphous silicon film, a sidewall 23 made of non-doped amorphous silicon is formed on the side surface of the stacked body made of the fin 20, the silicon nitride film 12, the silicon oxide film 14, the silicon nitride film 15, and the silicon oxide film 22. The impurity concentration of the sidewall 23 is lower than the impurity concentration of the silicon substrate 11.

Next, by e.g. wet etching with phosphoric acid, the silicon nitride film 15 (see FIGS. 5A to 5C) is removed. At this time, the silicon nitride film 12 is not removed because the silicon nitride film 12 is covered with the silicon oxide film 14 and the sidewall 23.

Figure 7A:
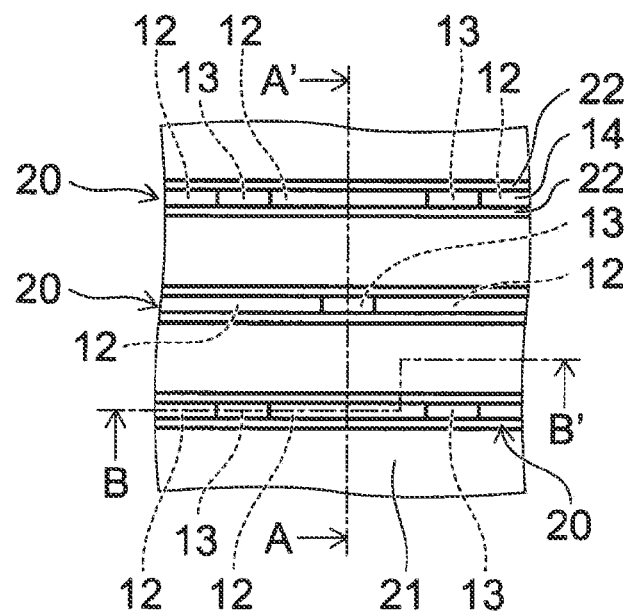
FIGS. 7A to 7C are process views illustrating a method for manufacturing a semiconductor device according to a first embodiment, where
Figure 7B:
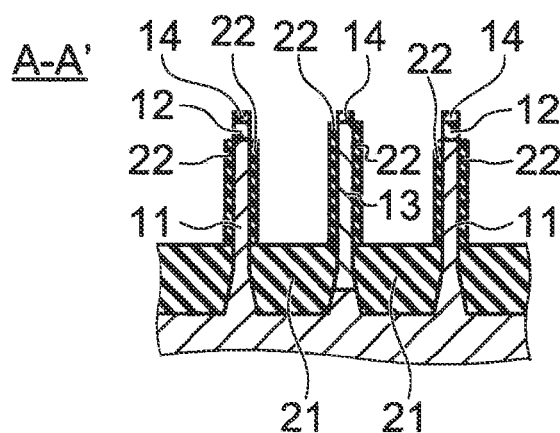
Figure 7C:
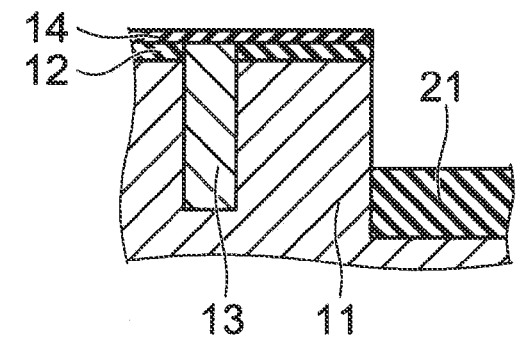

Next, as shown in FIGS. 7A to 7C, by wet etching with an alkaline solution, the sidewall 23 (see FIGS. 6A to 6C) is removed. At this time, the silicon substrate 11 and the silicon germanium member 13 are covered with the silicon oxide film 14 and the silicon oxide film 22, and hence are not removed.

Figure 8A:
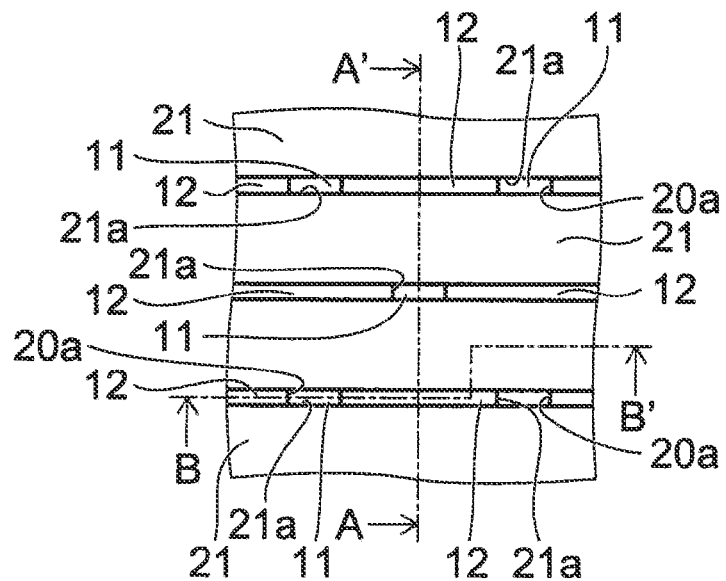
FIGS. 8A to 8C are process views illustrating a method for manufacturing a semiconductor device according to a first embodiment, where
Figure 8B:
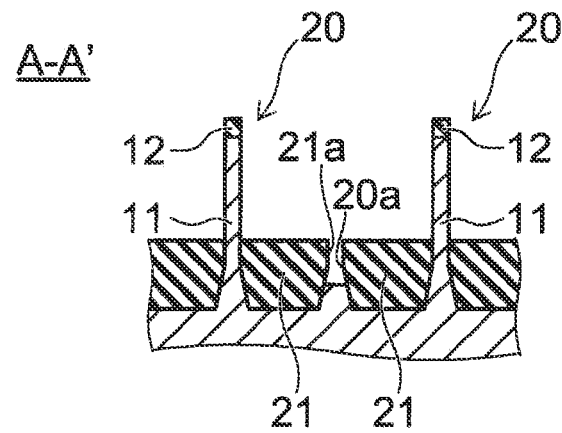
Figure 8C:
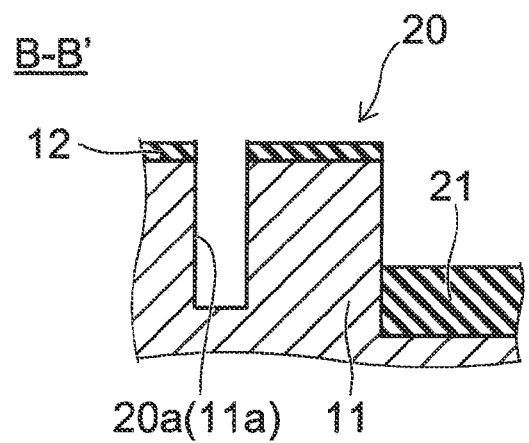

Next, as shown in FIGS. 8A to 8C, the silicon oxide film 14 and the silicon oxide film 22 (see FIGS. 7A to 7C) are removed.

Next, by wet etching with fluoro-nitric acid at room temperature or hot treatment with hydrochloric acid (HCl) at a temperature of 550-800° C., the silicon germanium member 13 (see FIGS. 7A to 7C) is removed. At this time, the silicon substrate 11 is not removed. Thus, the portion of the fin 20 constituted by the silicon germanium member 13 is eliminated. Thus, a gap 20a is formed in the fin 20. Furthermore, a depression 21a is formed in the upper surface of the device isolation insulating film 21.

Figure 9A:
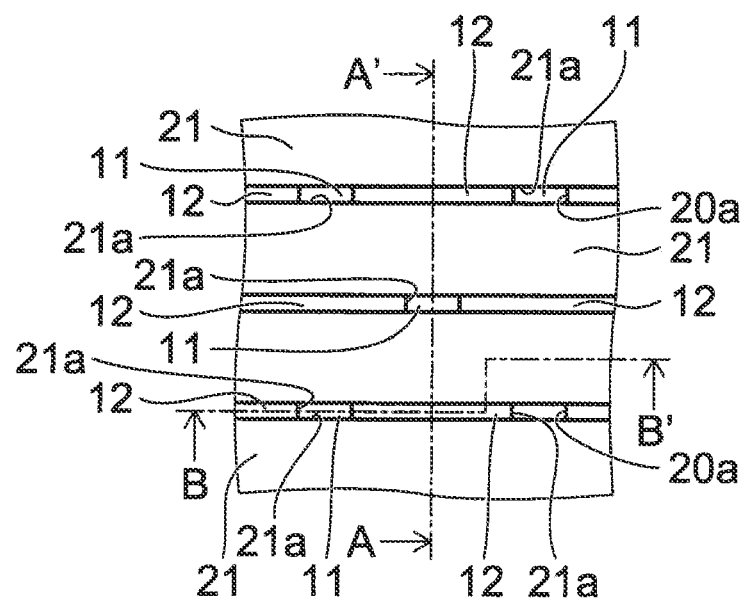
FIGS. 9A to 9C are process views illustrating a method for manufacturing a semiconductor device according to a first embodiment, where
Figure 9B:
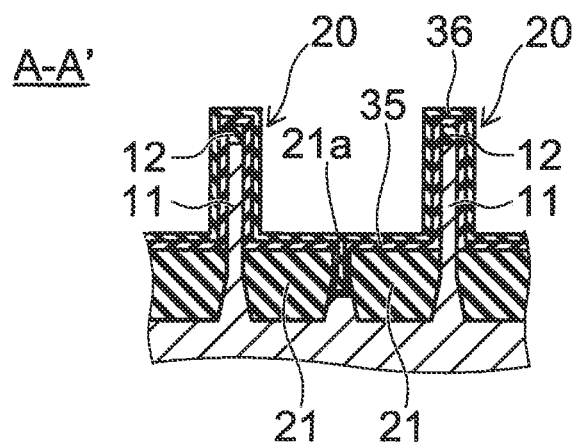
Figure 9C:
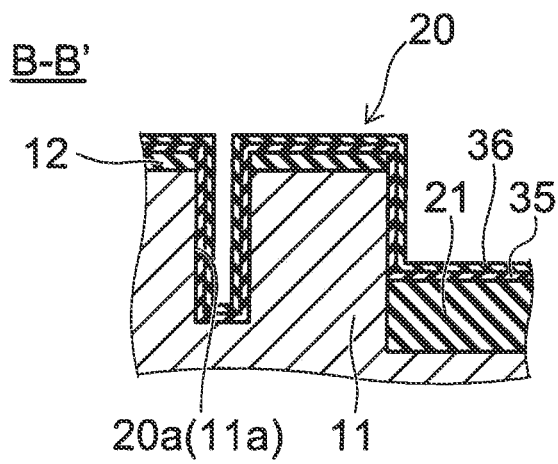

Next, as shown in FIGS. 9A to 9C, a silicon oxide film 35 is formed. Subsequently, a silicon nitride film 36 is formed. For convenience of illustration, in FIG. 9A, the silicon oxide film 35 and the silicon nitride film 36 are omitted. Next, the silicon nitride film 36 is etched back. Thus, while leaving the portion of the silicon nitride film 36 formed in the depression 21a, the other portion thereof is removed. Next, by wet etching with hydrogen fluoride (HF), while leaving the portion of the silicon oxide film 35 formed in the depression 21a, the other portion thereof is removed.

Figure 10A:
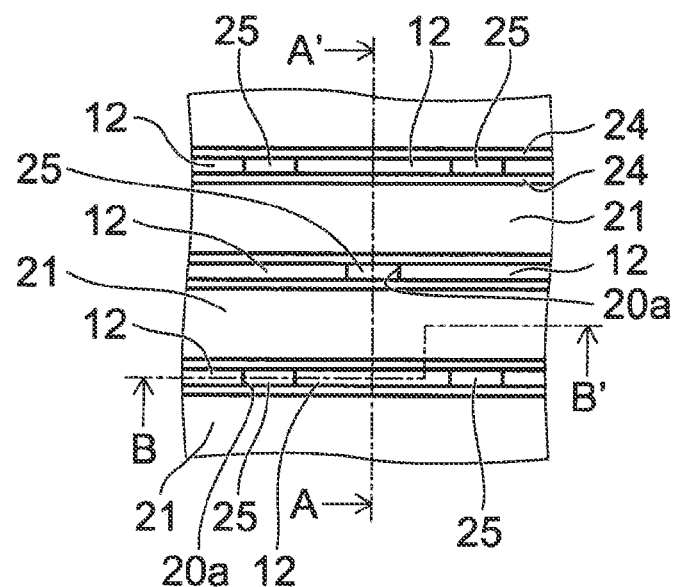
FIGS. 10A to 10C are process views illustrating a method for manufacturing a semiconductor device according to a first embodiment, where
Figure 10B:
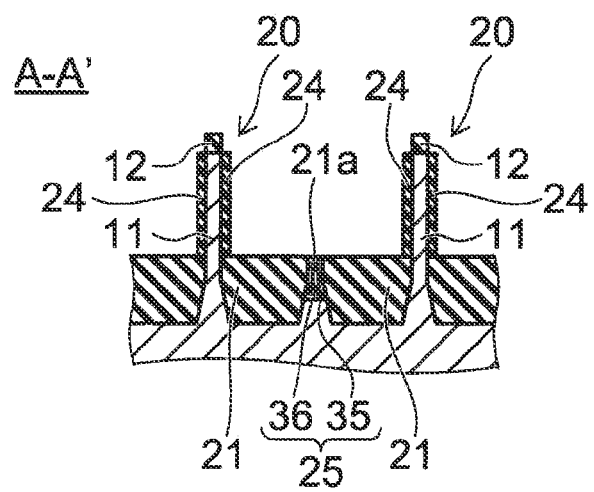
Figure 10C:
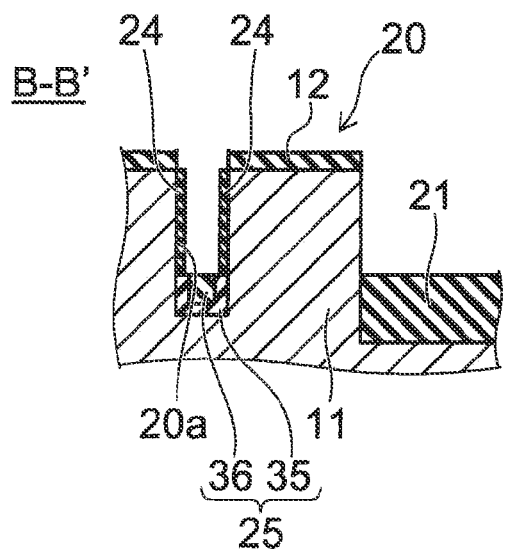

Thus, as shown in FIGS. 10A to 10C, the side surface of the fin 20 is exposed. Furthermore, an insulating member 25 with the silicon oxide film 35 and the silicon nitride film 36 stacked therein is buried in the depression 21a.

Subsequently, by oxidation treatment, a gate insulating film 24 is formed so as to cover the exposed surface of the fin 20.

Figure 11A:
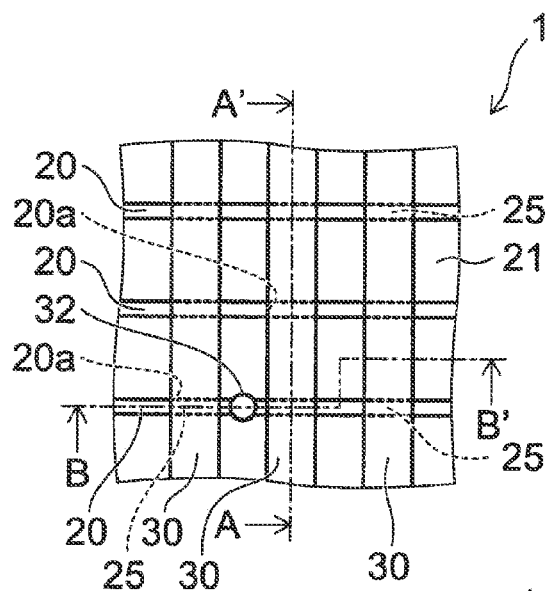
FIGS. 11A to 11C are process views illustrating a method for manufacturing a semiconductor device according to a first embodiment, where
Figure 11B:
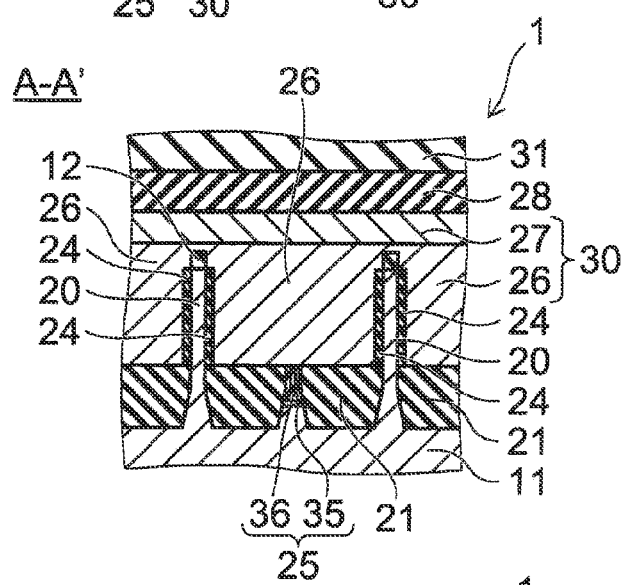
Figure 11C:
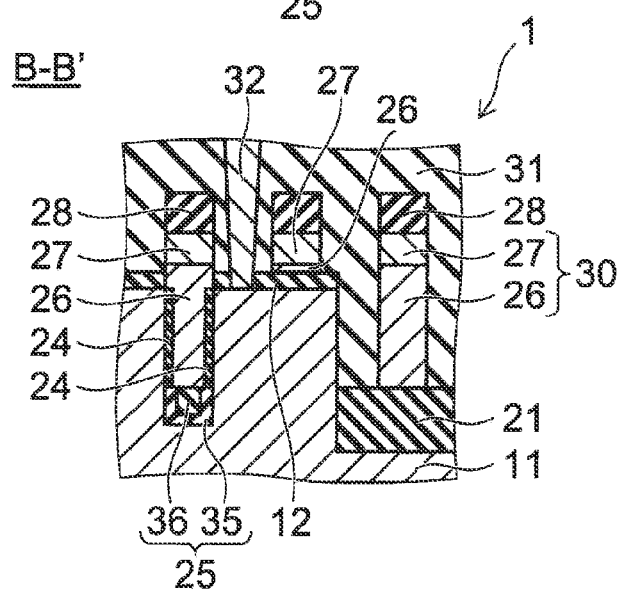

Next, as shown in FIGS. 11A to 11C, polysilicon doped with impurity is deposited on the entire surface to form a polysilicon film 26 covering the fin 20. Next, CMP is performed on the polysilicon film 26. At this time, no stopper is used. Next, on the polysilicon film 26, a metal film 27 made of e.g. tungsten is formed, and a silicon nitride film 28 is formed thereon. Next, a hard mask film is formed on the silicon nitride film 28 and patterned to form a plurality of hard masks (not shown). The hard masks extend in a direction crossing, such as orthogonal to, the extending direction of the fin 20, and are arranged periodically. Next, the hard masks are used as a mask to perform etching to selectively remove the silicon nitride film 28, the metal film 27, and the polysilicon film 26. At this time, immediately above the fin 20, the etching is stopped at the silicon nitride film 12. Thus, a plurality of gate electrodes 30 extending parallel to each other are formed on the device isolation insulating film 21 so as to straddle the fin 20. The portion below the gate electrode 30 is constituted by the polysilicon film 26. The portion above the gate electrode 30 is constituted by the metal film 27.

Next, the gate electrodes 30 are used as a mask to implant impurity into the fin 20. Thus, a diffusion layer (not shown) is formed in the fin 20. Accordingly, a FinFET is configured at each nearest point between the fin 20 and the gate electrode 30. As viewed from above, a plurality of fins 20 and gate electrodes 30 are arranged like a lattice. Hence, a plurality of FinFETs are arrayed like a matrix. The portion where the silicon germanium member 13 (see FIGS. 2A to 2C) was formed constitutes a gap 20a of the fin 20. Next, on the device isolation insulating film 21, an interlayer insulating film 31 is formed so as to cover the gate electrodes 30. In FIG. 11A, for convenience of illustration, the silicon nitride film 12, the silicon nitride film 28, and the interlayer insulating film 31 are omitted. Next, contacts 32 are formed in the interlayer insulating film 31. The contact 32 is formed on each region immediately above the diffusion layer of the fin 20. That is, as viewed from above, a plurality of contact 32 are formed on respective portions of the fin 20 not covered with the gate electrode 30. However, for convenience of illustration, FIGS. 11A and 11C show only one contact 32. Subsequently, a magnetoresistive effect element (not shown) is formed on the interlayer insulating film 31 and connected to each FinFET through the contact 32. Thus, the semiconductor device 1 according to the embodiment is manufactured.

Next, the effect of the embodiment is described.

In the embodiment, in the step shown in FIGS. 2A to 2C, a silicon germanium member 13 is buried in part of the upper portion of the silicon substrate 11. In the step shown in FIGS. 4A to 4C, the silicon substrate 11 and the silicon germanium member 13 are simultaneously processed to form a fin 20. Then, in the step shown in FIGS. 8A to 8C, the silicon germanium member 13 is removed to form a gap 20a in the fin 20. Thus, in the step of forming the fin 20 shown in FIGS. 4A to 4C, the fin 20 is constituted by the silicon substrate 11 and the silicon germanium member 13, and no gap 20a is formed therein. Hence, the distance between the fins 20 can be made uniform. Thus, the microloading effect can be suppressed, and the silicon substrate 11 and the silicon germanium member 13 can be etched under a uniform condition throughout the processed region. As a result, the fins 20 can be processed into a uniform shape, and the characteristics of FinFETs can be made uniform.

More specifically, the effect of etching in forming the fin 20 depends on the distance to the adjacent fin 20. Thus, if the presence of the gap causes a large difference in the distance to the adjacent fin 20, the shape of the processed fin 20 is significantly varied by the microloading effect. For instance, consider the case where the etching condition is optimized for the arrangement of the fins 20 at a short pitch. Then, if the distance to the adjacent fin 20 is large, the slope of the side surface of the root portion of the fin 20 is increased, and the root portion is thickened. This varies the characteristics of the FinFET whose body region is made of the fin 20. In contrast, according to the embodiment, even in the region where a gap 20a is to be formed in a subsequent step, the fin 20 is formed from the silicon germanium member 13. Hence, the distance between the fins 20 can be made nearly equal, and the effect of etching can be made uniform. As a result, also near the gap 20a, the shape of the fins 20 can be made uniform. Thus, according to the embodiment, in a device requiring a gap 20a to be formed in the fin 20, the shape accuracy of the fin 20 can be enhanced, and the characteristics of the FinFETs can be made uniform. This effect is particularly significant in the case where the fin 20 has a high aspect ratio.

Furthermore, in the step shown in FIGS. 4A to 4C, the fins 20 are formed at equal intervals. Thus, in the step shown in FIGS. 5A to 5C, the device isolation insulating film 21 can be uniformly formed. For instance, the shrinkage ratio of the device isolation insulating film 21 under heating and densification is made uniform. Thus, the composition of the device isolation insulating film 21 is made uniform. As a result, in etching the device isolation insulating film 21, a uniform etching rate can be obtained. Thus, the upper surface of the device isolation insulating film 21 can be made flat. Hence, when gate electrodes 30 are formed in the step shown in FIGS. 11A to 11C, the height of the portion of the fin 20 covered with the gate electrode 30 is made uniform. Thus, the channel width of the FinFET is made uniform. Also for this reason, the characteristics of the FinFETs can be made uniform.

Furthermore, in the embodiment, in the step shown in FIGS. 4A to 4C, the patterned silicon nitride film 15 is used as a mask to form a fin 20. Then, in the step shown in FIGS. 6A to 6C, when the silicon nitride film 15 is removed, a sidewall 23 made of non-doped amorphous silicon is formed on the side surface of the stacked body made of the fin 20, the silicon nitride film 12, the silicon oxide film 14, and the silicon nitride film 15. Thus, only the silicon nitride film 15 can be removed while protecting the silicon nitride film 12 by the silicon oxide film 14 and the sidewall 23. Subsequently, the sidewall 23 is removed. Thus, only the silicon nitride film 15 can be removed without collapsing the fin 20. Accordingly, the yield of the semiconductor device 1 is improved.

This process and effect can be described in broader terms as follows.

FIGS. 12A to 12F are process sectional views illustrating the sidewall covering process in the embodiment.

Figure 12A:
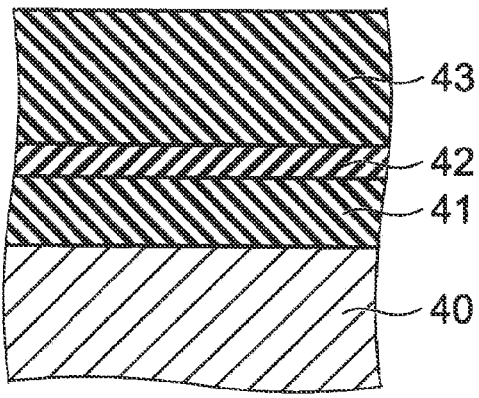
FIGS. 12A to 12F are process sectional views illustrating the sidewall covering process in the embodiment.

As shown in FIG. 12A, a first film 41 made of a first material, a second film 42 made of a second material different from the first material, and a third film 43 made of a third material different from the second material are stacked in this order on a semiconductor substrate 40. Here, the first material and the third material may be the same material, or may be different materials. If the first material and the third material are the same material, then the material can be suitably allotted under the constrained condition of the semiconductor process. In the embodiment, the semiconductor substrate 40 is a silicon substrate 11. The first film 41 is a silicon nitride film 12, and the first material is silicon nitride. The second film 42 is a silicon oxide film 14, and the second material is silicon oxide. The third film 43 is a silicon nitride film 15, and the third material is silicon nitride.

Figure 12B:
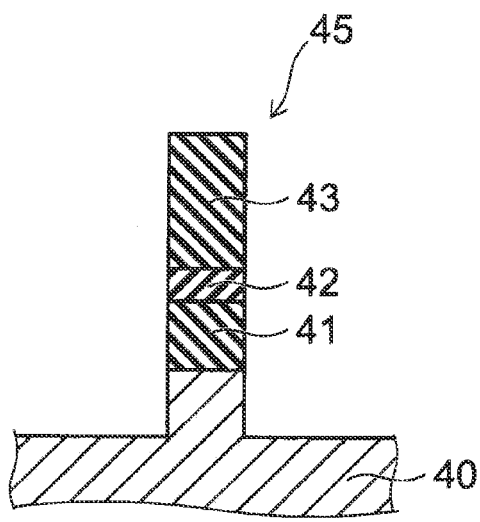

Next, as shown in FIG. 12B, the third film 43, the second film 42, the first film 41, and the semiconductor substrate 40 are patterned to form a stacked body 45. The stacked body 45 includes an upper portion of the semiconductor substrate 40, the first film 41, the second film 42, and the third film 43.

Figure 12C:
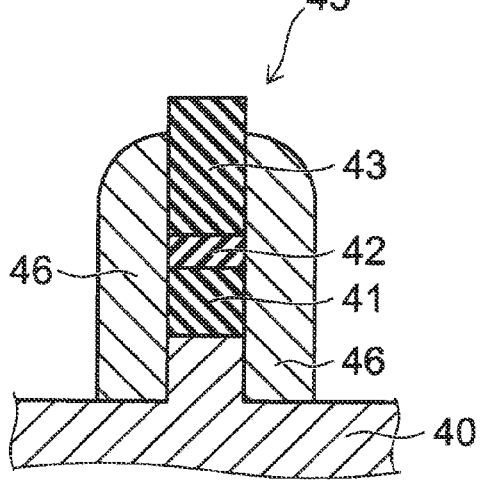

Next, as shown in FIG. 12C, a sidewall 46 made of a material different from any of the first material, the second material, and the third material is formed on the side surface of the stacked body 45. In the embodiment, the sidewall 46 (sidewall 23) is formed from non-doped amorphous silicon.

Figure 12D:
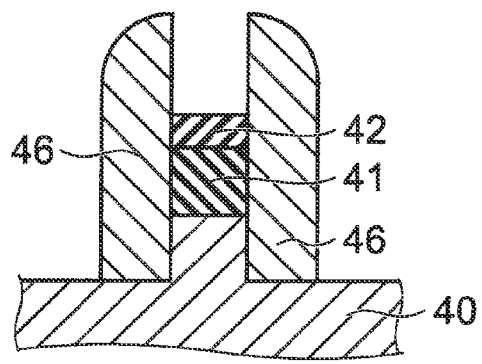

Next, as shown in FIG. 12D, the third film 43 is removed. At this time, the stacked body 45 is supported by the sidewall 46. Furthermore, the first film 41 is protected by the second film 42 and the sidewall 46. Thus, only the third film 43 can be removed.

Figure 12E:
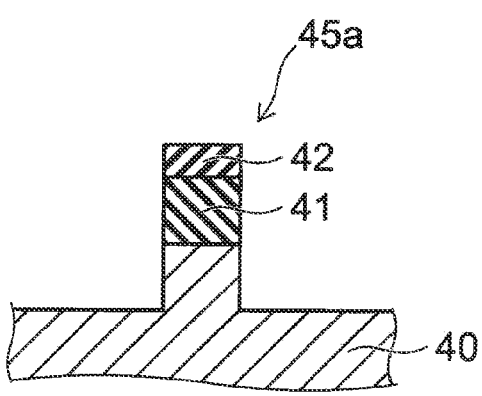

Next, as shown in FIG. 12E, the sidewall 46 is removed. Thus, a stacked body 45a with the first film 41 and the second film 42 stacked therein is left on the semiconductor substrate 40.

Figure 12F:
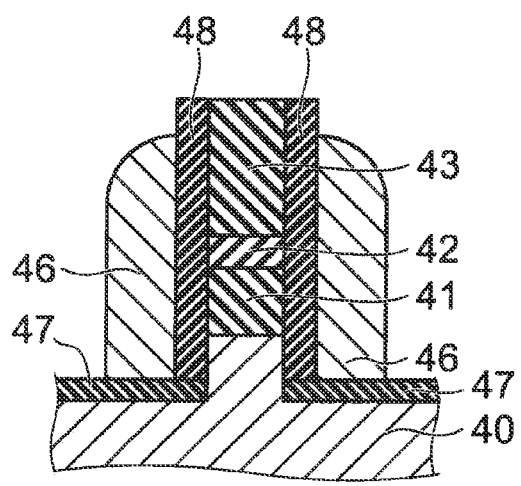

As in the embodiment, if the semiconductor substrate 40 and the sidewall 46 include the same component (e.g., silicon), then as shown in FIG. 12F, before forming the sidewall 46, a fourth film 47 made of a material different from the third material and the material of the sidewall may be formed on the region of the upper surface of the semiconductor substrate 40 where the stacked body 45 is not formed. Furthermore, a fifth film 48 made of a material different from the third material and the material of the sidewall may be formed on the side surface of the portion of the semiconductor substrate 40 constituting the stacked body 45. At this time, the fourth film 47 and the fifth film 48 may be formed from the same material. Thus, even if etching is performed under the condition such that both the semiconductor substrate 40 and the sidewall 46 are etched, only the sidewall 46 can be removed by protecting the semiconductor substrate 40 by the fourth film 47, the fifth film 48, and the second film 42.

Furthermore, in the embodiment, in the step shown in FIGS. 1A to 1C, a silicon nitride film 12 is formed on the silicon substrate 11. In the step shown in FIGS. 4A to 4C, when the fin 20 is formed, the silicon nitride film 12 is also processed and left on the fin 20. In the step shown in FIGS. 11A to 11C, when the polysilicon film 26 and the like are etched to form a gate electrode 30, the silicon nitride film 12 is used as a stopper immediately above the fin 20. Thus, when the gate electrode 30 is formed, overetching of the fin 20 can be prevented.

In the step shown in FIGS. 11A to 11C, also when CMP is performed on the polysilicon film 26, the silicon nitride film 12 may be used as a stopper. Thus, the film thickness of the polysilicon film 26 can be accurately controlled, and the characteristics of the FinFETs can be made more uniform.

Next, a comparative example of the embodiment is described.

Figure 13A:
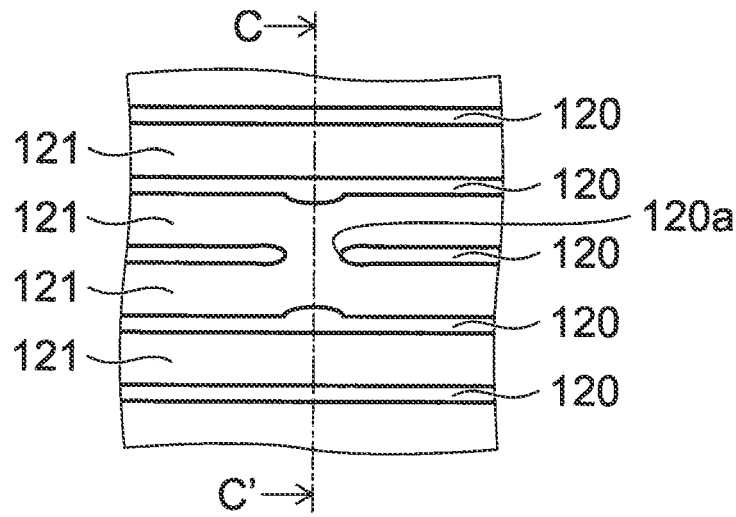
FIGS. 13A and 13B are process views showing a method for manufacturing a semiconductor device according to a comparative example, where
Figure 13B:
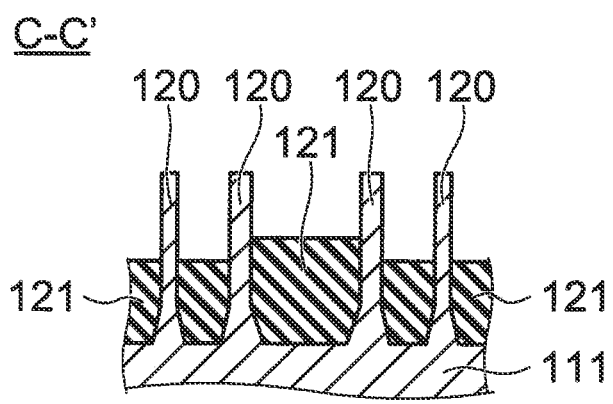

FIGS. 13A and 13B are process views showing a method for manufacturing a semiconductor device according to this comparative example. More specifically, FIG. 13A is a plan view. FIG. 13B is a sectional view taken along line C-C' shown in FIG. 13A.

Figure 14A:
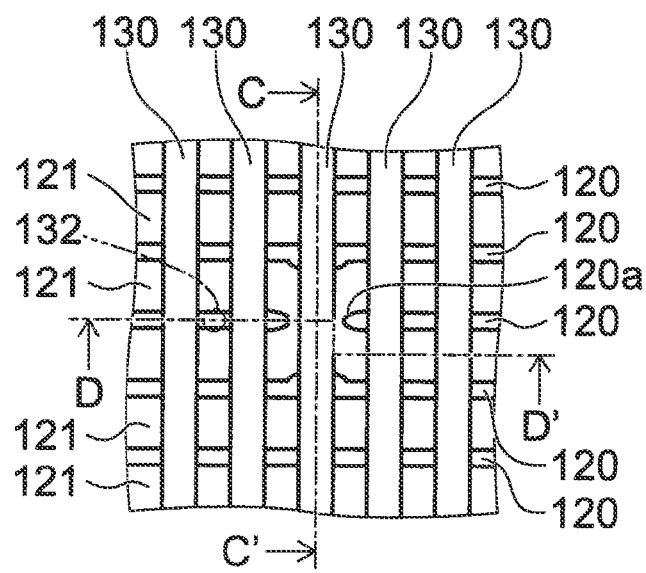
FIGS. 14A to 14C are process views showing the method for manufacturing a semiconductor device according to a comparative example.
Figure 14B:
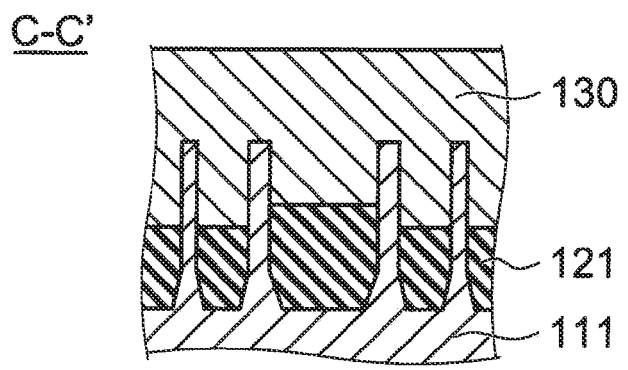
Figure 14C:
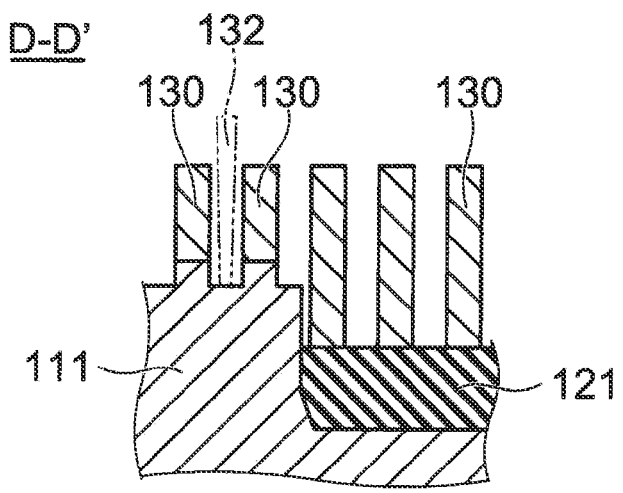

FIGS. 14A to 14C are process views showing the method for manufacturing a semiconductor device according to this comparative example. More specifically, FIG. 14A is a plan view. FIG. 14B is a sectional view taken along line C-C' shown in FIG. 14A. FIG. 14C is a sectional view taken along line D-D' shown in FIG. 14A.

In this comparative example, a gap is formed in the fin by patterning without burying a sacrificial material in the silicon substrate.

As shown in FIGS. 13A and 13B, in this comparative example, etching is performed on the upper surface of a silicon substrate 111 to form fins 120. At this time, without burying a silicon germanium member in the upper portion of the silicon substrate 111, a gap 120a is formed in a prescribed fin 120 by patterning.

However, in this case, in the region where the gap 120a is formed, the distance between two fins 120 opposed across the gap 120a is made longer. Thus, by the microloading effect, the shape of the portion of the fins 120 opposed to the gap 120a is varied. For instance, the portion of the fin 120 located near the gap 120a is made generally thicker than the other fins 120. The side surface on the gap 120a side is tapered not only in the root portion but also entirely, including the upper portion. The slope of the side surface in the root portion is made more gradual. Thus, in the portion of the fin 120 located near the gap 120a, the root portion is made thicker than the other portion, and the shape is made asymmetric.

Furthermore, the distance between the fins 120 opposed across the gap 120a is longer than the distance between the fins 120 in the other region. Hence, near the gap 120a, when the device isolation insulating film 121 is formed, the degree of densification is different. As a result, the composition of the densified device isolation insulating film 121 is made different, and the etching rate is made different. Specifically, near the gap 120a, the space between the fins is wider than in the other region. Hence, near the gap 120a, densification proceeds further, and the etching rate is made lower in subsequent wet etching. As a result, the upper surface of the device isolation insulating film 121 is made higher than in the surroundings. By these factors, the characteristics of the FinFET formed near the gap 120a are made significantly different from the characteristics of the other FinFETs.

Furthermore, as shown in FIGS. 14A to 14C, in this comparative example, the silicon nitride film 12 (see FIGS. 11A to 11C) is not provided on the fin 120. Hence, when the polysilicon film is etched and processed into a gate electrode 130, local overetching occurs at the upper surface of the fin 120. Thus, the upper surface of the portion of the fin 120 not covered with the gate electrode 130, i.e., of the portion constituting a source/drain, is set back. To this portion constituting a source/drain, an inversely tapered contact 132 is connected. However, the position of the upper surface of this portion is lowered. This decreases the area of the lower end of the contact 132, and increases the resistance.

In contrast, as described above, in the embodiment, part of the silicon substrate 11 is replaced by a silicon germanium member 13. Thus, in the step of processing the fin 20 and the step of forming a device isolation insulating film 21, the gap 20a is not formed. Hence, the distance between the fins 20 is made uniform. Thus, the fin 20 and the device isolation insulating film 21 can be uniformly formed. Furthermore, in the embodiment, a silicon nitride film 12 is provided on the silicon substrate 11. When the fin 20 is formed, the silicon nitride film 12 is also processed and left on the fin 20. The silicon nitride film 12 is used as a stopper to process a gate electrode 30. As a result, when the gate electrode 30 is patterned, overetching of the upper surface of the fin 20 can be prevented. This can prevent the decrease of the area of the lower surface of the contact 32.

Next, a second embodiment is described.

FIGS. 15A to 18C are process views illustrating a method for manufacturing a semiconductor device according to the embodiment. Each figure with suffix A is a plan view. Each figure with suffix B is a sectional view taken along line A-A' shown in the corresponding figure with suffix A. Each figure with suffix C is a sectional view taken along line B-B' shown in the corresponding figure with suffix A.

First, as shown in FIGS. 1A to 1C, a silicon nitride film 12 is formed on the silicon substrate 11. By etching, an opening 12a and a depression 11a are formed.

Figure 15A:
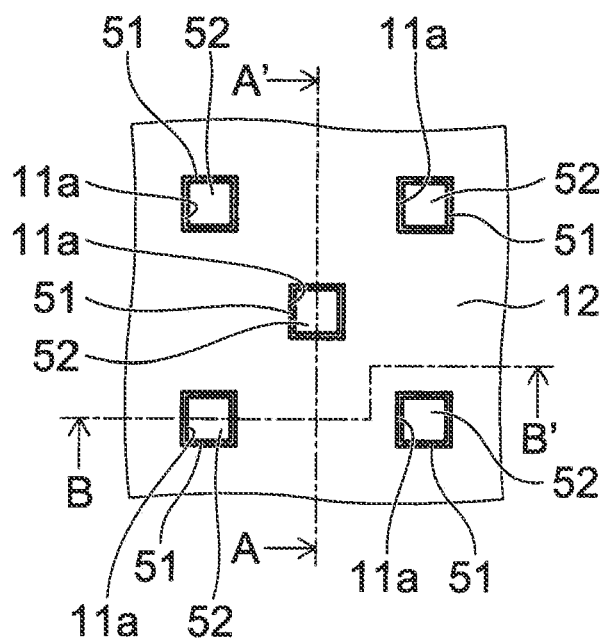
FIGS. 15A to 15C are process views illustrating a method for manufacturing a semiconductor device according to a second embodiment, where
Figure 15B:
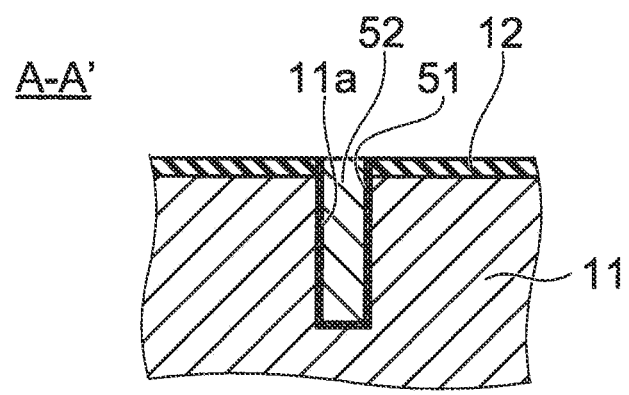
Figure 15C:
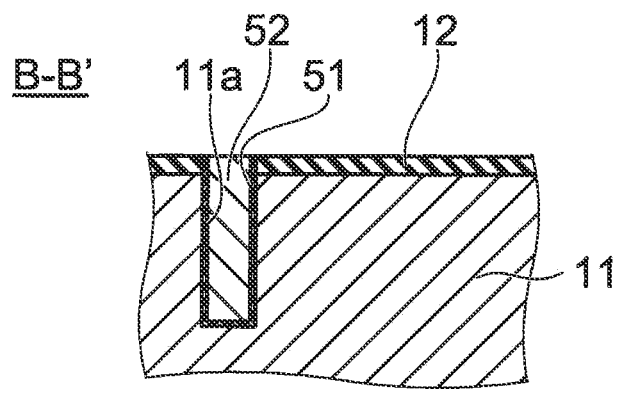

Next, as shown in FIGS. 15A to 15C, a barrier film 51 is formed on the inner surface of the depression 11a. For instance, by nitridation treatment, a nitride film having a film thickness of less than 10 nm is formed as a barrier film 51. Next, silicon is deposited on the entire surface and etched back. Thus, a silicon member 52 is placed as a sacrificial material in the depression 11a and the opening 12a. At this time, the portion of the barrier film 51 formed on the silicon nitride film 12 may be simultaneously removed when etching back the silicon member 52, or may be left and treated integrally with the silicon nitride film 12.

Next, steps similar to the steps shown in FIGS. 2A to 6C are performed as in the above first embodiment.

More specifically, on the silicon nitride film 12 and the silicon member 52, a silicon oxide film 14 is formed. A silicon nitride film 15 is formed thereon. Next, a hard mask 16 processed into a line-shaped pattern is formed on the silicon nitride film 15 and used as a mask to perform etching. Thus, the silicon substrate 11 and the silicon member 52 are selectively removed to form a plurality of fins 20. At this time, no gap is formed in the fin 20, and part of the fin 20 is formed from the silicon member 52. The barrier film 51 is interposed between the silicon member 52 and the silicon substrate 11. Next, a device isolation insulating film 21 is formed in a lower portion of the space between the fins 20. Next, a silicon oxide film 22 is formed on the exposed surface of the fin 20. Next, amorphous silicon not doped with impurity is deposited on the entire surface and etched back. Thus, a sidewall 23 made of non-doped amorphous silicon is formed on the side surface of the fin 20. At this time, the upper portion of the silicon nitride film 15 is exposed.

Figure 16A:
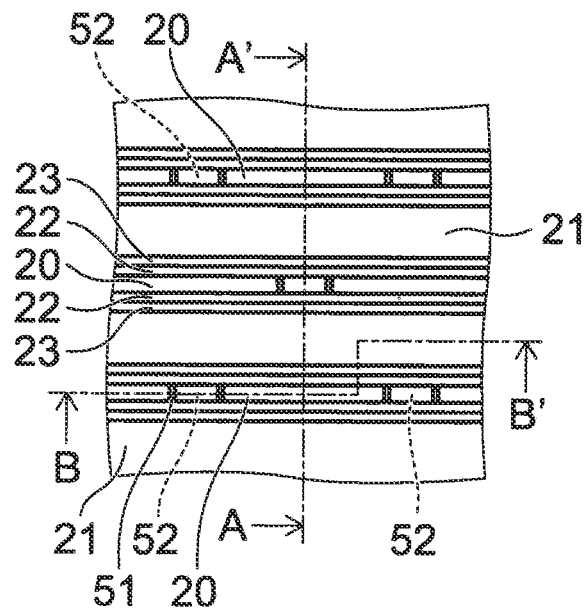
FIGS. 16A to 16C are process views illustrating a method for manufacturing a semiconductor device according to a second embodiment, where
Figure 16B:
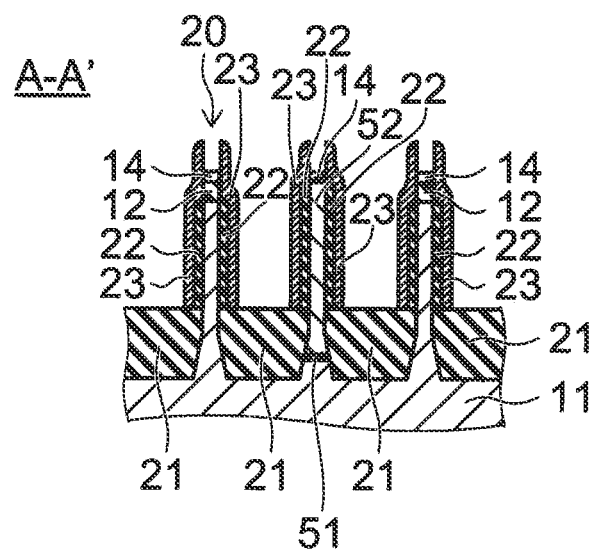
Figure 16C:
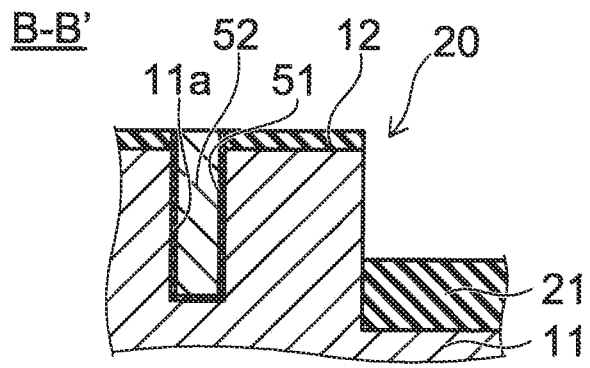

Next, as shown in FIGS. 16A to 16C, by e.g. wet etching with phosphoric acid, the silicon nitride film 15 (see FIGS. 6A to 6C) is removed.

Next, by wet etching with an etching liquid containing hydrogen fluoride (HF), the silicon oxide film 14 is removed to expose the silicon member 52. Next, by wet etching with an alkaline solution, the sidewall 23 and the silicon member 52 made of silicon are removed. At this time, the silicon oxide film 22 is located between the sidewall 23 and silicon substrate 11, and the barrier film 51 made of e.g. silicon nitride is located between the silicon member 52 and the silicon substrate 11. This can prevent the silicon substrate 11 from being etched by this etching. Subsequently, by wet etching with an etching liquid containing hydrogen fluoride (HF), the silicon oxide film 22 is removed.

Figure 17A:
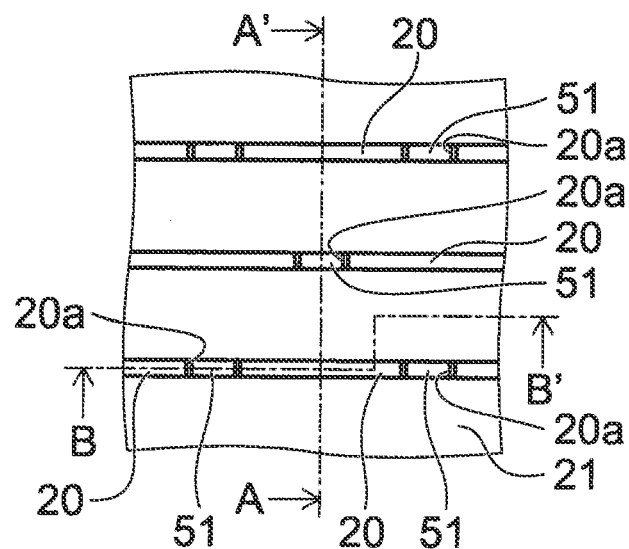
FIGS. 17A to 17C are process views illustrating a method for manufacturing a semiconductor device according to a second embodiment, where
Figure 17B:
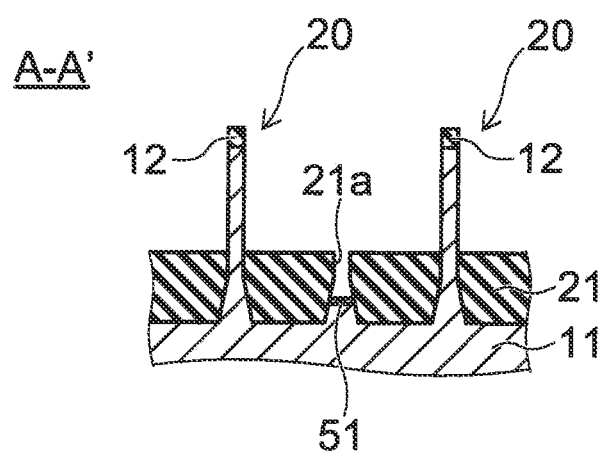
Figure 17C:
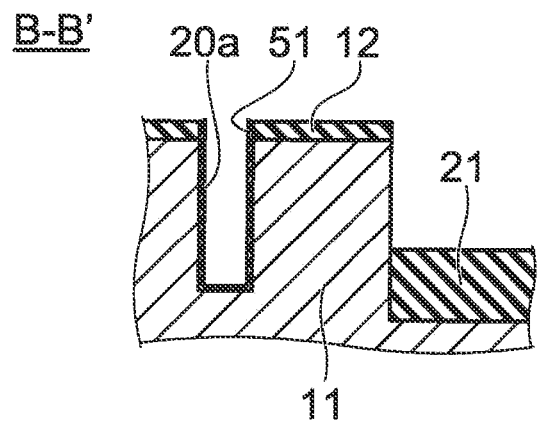

By this process, as shown in FIGS. 17A to 17C, a gap 20a is formed in the portion of the fin 20 where the silicon member 52 (see FIGS. 16A to 16C) has been removed. Furthermore, a depression 21a is formed in the upper surface of the device isolation insulating film 21. The barrier film 51 is left at the bottom of the depression 21a.

Figure 18A:
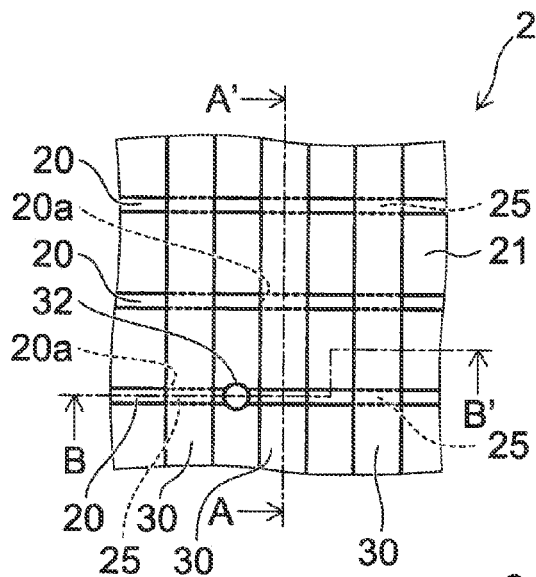
FIGS. 18A to 18C are process views illustrating a method for manufacturing a semiconductor device according to a second embodiment, where
Figure 18B:
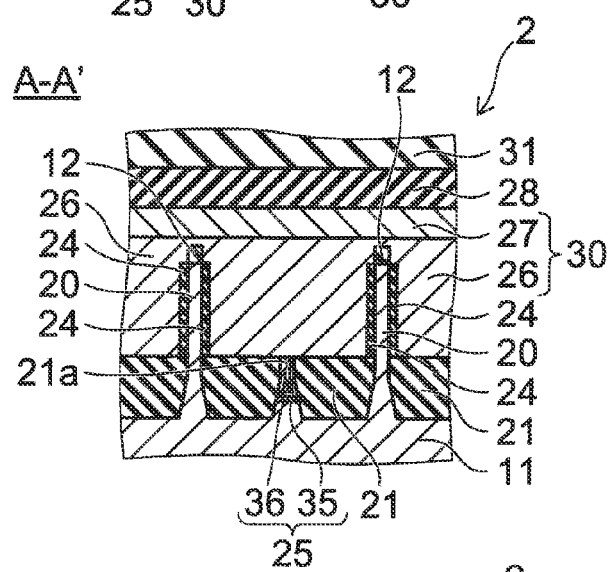
Figure 18C:
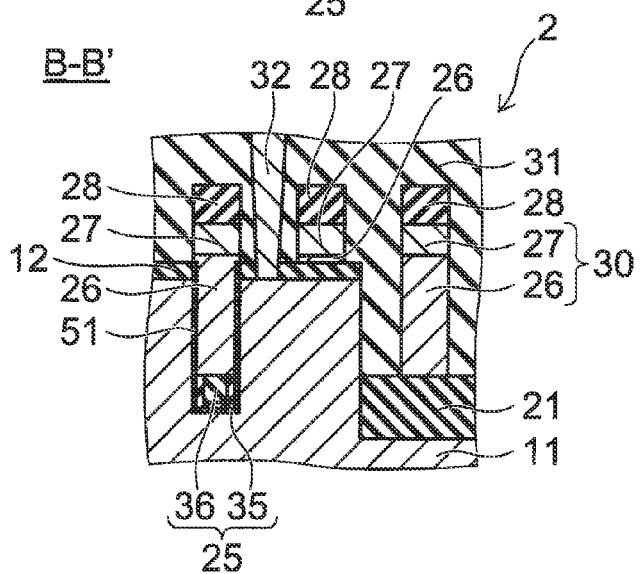

The subsequent steps are similar to the steps shown in FIGS. 10A to 11C. More specifically, as shown in FIGS. 18A to 18C, a silicon oxide film 35 and a silicon nitride film 36 are formed and etched back to leave them only in the depression 21a. Thus, an insulating member 25 made of the silicon oxide film 35 and the silicon nitride film 36 is buried in the depression 21a. Next, by wet etching, the silicon oxide film is removed. Next, by e.g. oxidation treatment, a gate insulating film 24 is formed so as to cover the exposed surface of the fin 20. Next, a polysilicon film 26, a metal film 27, and a silicon nitride film 28 are deposited and etched to form a plurality of gate electrodes 30 straddling the fin 20 and extending in a direction crossing the fin 20. Next, the gate electrodes 30 are used as a mask to implant impurity to form a FinFET. Subsequently, an interlayer insulating film 31 and contacts 32 are formed. A magnetoresistive effect element is formed thereon. In FIG. 18A, for convenience of illustration, the silicon nitride film 12, the silicon nitride film 28, and the interlayer insulating film 31 are omitted. Furthermore, only one contact 32 is shown. Thus, the semiconductor device 2 according to the embodiment is manufactured.

Next, the effect of the embodiment is described.

According to the embodiment, in the step shown in FIGS. 15A to 15C, a barrier film 51 is formed on the inner surface of the depression 11a. Subsequently, a silicon member 52 is buried in the depression 11a. Accordingly, when a fin 20 is processed by etching, part of the fin 20 is constituted by the silicon member 52. Thus, similarly to the above first embodiment, the microloading effect can be suppressed, and the fins 20 can be uniformly formed. Furthermore, also in forming the device isolation insulating film 21, no gap 20a is formed in the fin 20. Thus, the device isolation insulating film 21 can be uniformly densified. Hence, the etching amount in wet etching can be made uniform.

In the step shown in FIGS. 17A to 17C, by removing the silicon member 52, a gap 20a can be formed in the fin 20. At this time, the barrier film 51 is provided between the silicon substrate 11 and the silicon member 52. Hence, only the silicon member 52 can be removed without removing the silicon substrate 11.

Furthermore, in the embodiment, unlike the above first embodiment, there is no need to deposit special materials such as silicon germanium. This simplifies the process.

The manufacturing method, configuration, and effect of the embodiment other than the foregoing are similar to those of the above first embodiment.

Next, a third embodiment is described.

FIGS. 19A to 25C are process views illustrating a method for manufacturing a semiconductor device according to the embodiment. Each figure with suffix A is a plan view. Each figure with suffix B is a sectional view taken along line A-A' shown in the corresponding figure with suffix A. Each figure with suffix C is a sectional view taken along line B-B' shown in the corresponding figure with suffix A.

First, similarly to the above first embodiment, the steps shown in FIGS. 1A to 5C are performed.

More specifically, as shown in FIGS. 1A to 1C, a silicon nitride film 12 is formed on the silicon substrate 11. By etching, an opening 12a and a depression 11a are formed.

Next, as shown in FIGS. 2A to 2C, by e.g. the selective epitaxial growth method, a silicon germanium (SiGe) member 13 is placed in the depression 11a and in the opening 12a. Next, as shown in FIGS. 3A to 3C, a silicon oxide film 14 and a silicon nitride film 15 are stacked, and a hard mask 16 is formed thereon. Next, as shown in FIGS. 4A to 4C, the hard mask 16 is used as a mask to perform etching to form fins 20. Next, as shown in FIGS. 5A to 5C, a device isolation insulating film 21 is formed in a lower portion of the space between the fins 20.

The subsequent steps are different from those of the above first embodiment.

Figure 19A:
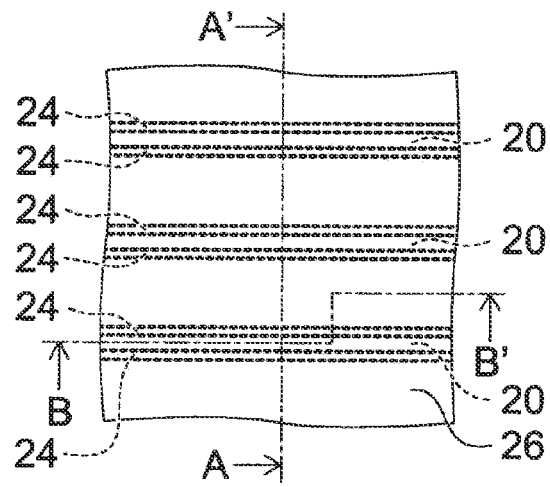
FIGS. 19A to 19C are process views illustrating a method for manufacturing a semiconductor device according to a third embodiment, where
Figure 19B:
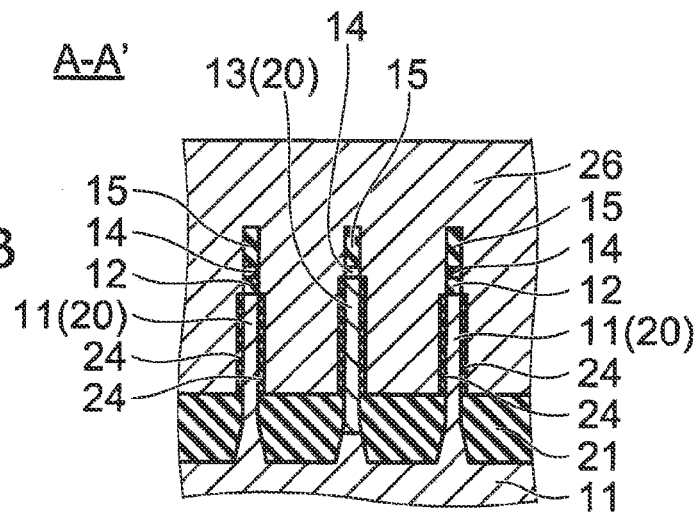
Figure 19C:
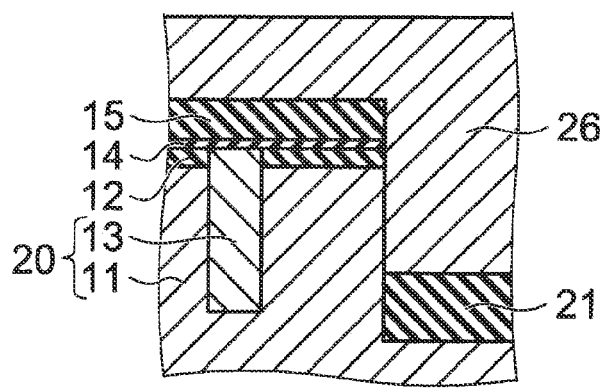

First, as shown in FIGS. 19A to 19C, by oxidation treatment, a gate insulating film 24 is formed on the exposed surface of the fin 20. Next, polysilicon doped with impurity is deposited on the entire surface to form a polysilicon film 26 so as to cover the fin 20.

Figure 20A:
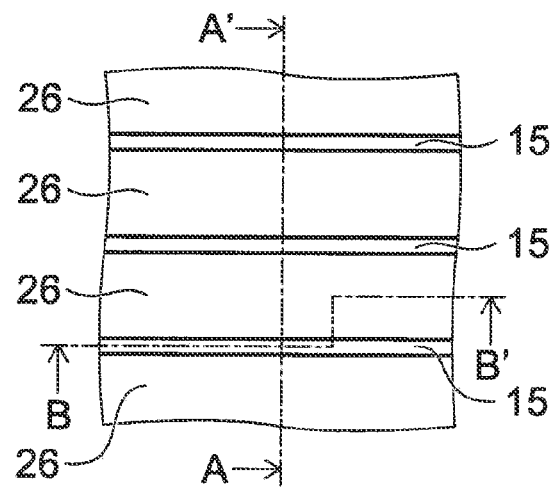
FIGS. 20A to 20C are process views illustrating a method for manufacturing a semiconductor device according to a third embodiment, where
Figure 20B:
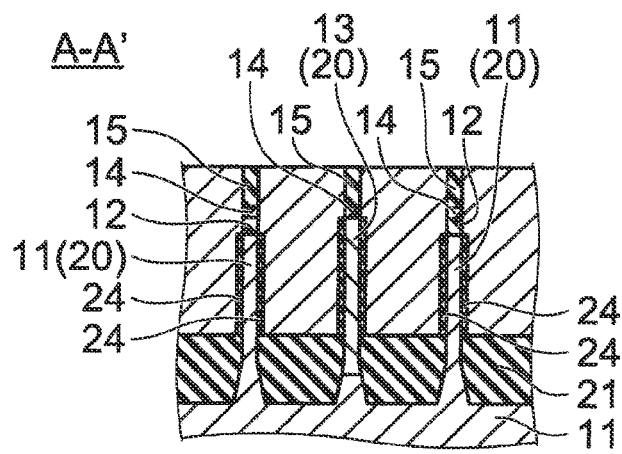
Figure 20C:
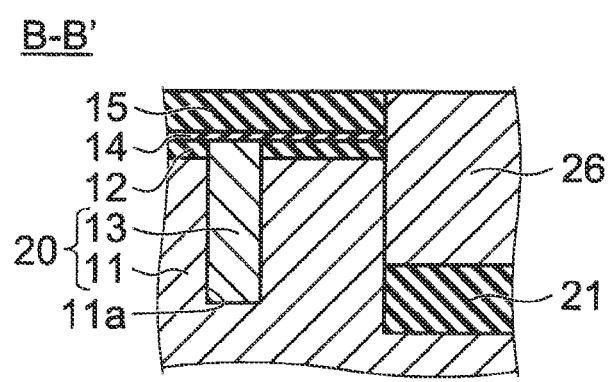

Next, as shown in FIGS. 20A to 20C, the silicon nitride film 15 is used as a stopper to perform CMP on the polysilicon film 26. Thus, the upper surface of the polysilicon film 26 is aligned with the upper surface of the silicon nitride film 15. At this time, the silicon nitride film 15 is exposed at the upper surface of the polysilicon film 26.

Figure 21A:
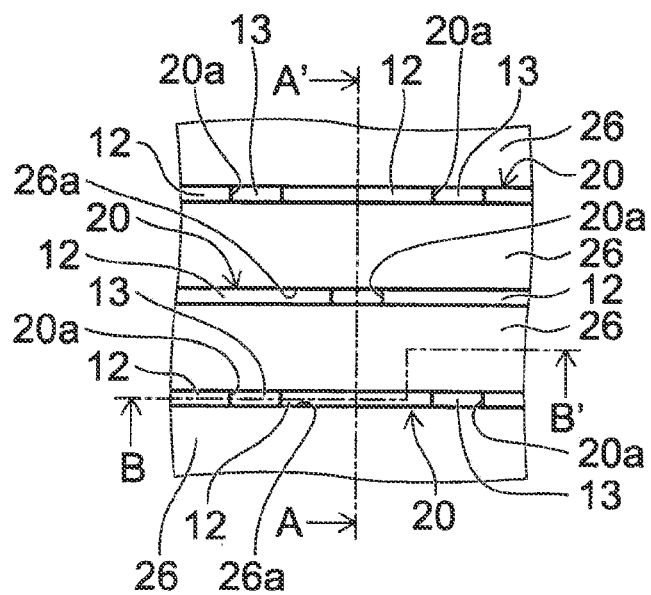
FIGS. 21A to 21C are process views illustrating a method for manufacturing a semiconductor device according to a third embodiment, where
Figure 21B:
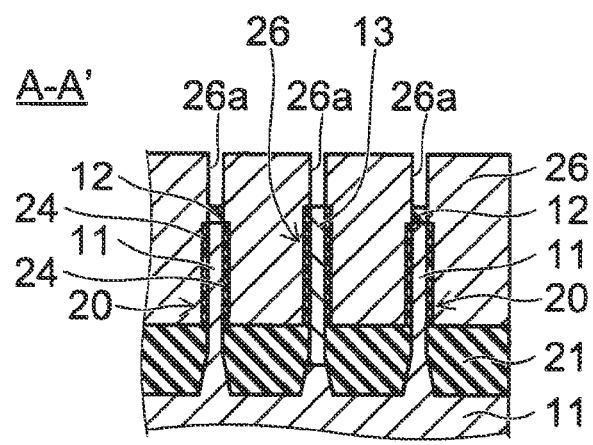
Figure 21C:
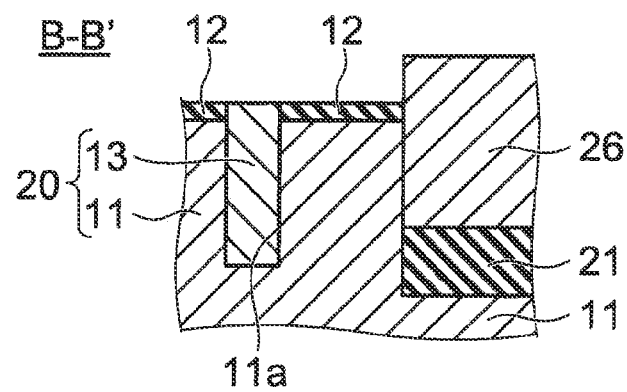

Next, as shown in FIGS. 21A to 21C, by e.g. wet etching with phosphoric acid, the silicon nitride film 15 (see FIGS. 20A to 20C) is removed. Thus, in the upper surface of the polysilicon film 26, a trench 26a is formed in the space formed by the removal of the silicon nitride film 15. Next, by e.g. wet etching with hydrofluoric acid, the silicon oxide film 14 (see FIGS. 20A to 20C) is removed from the bottom surface of the trench 26a. Thus, at the bottom surface of the trench 26a, the silicon nitride film 12 and the silicon germanium member 13 are exposed.

Figure 22A:
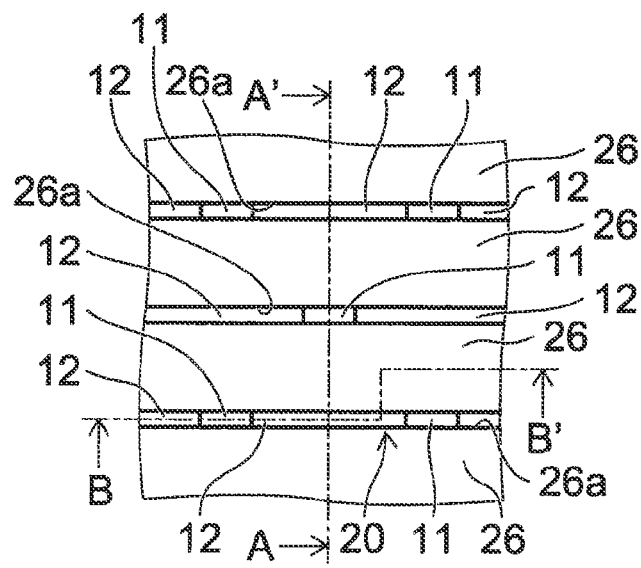
FIGS. 22A to 22C are process views illustrating a method for manufacturing a semiconductor device according to a third embodiment, where
Figure 22B:
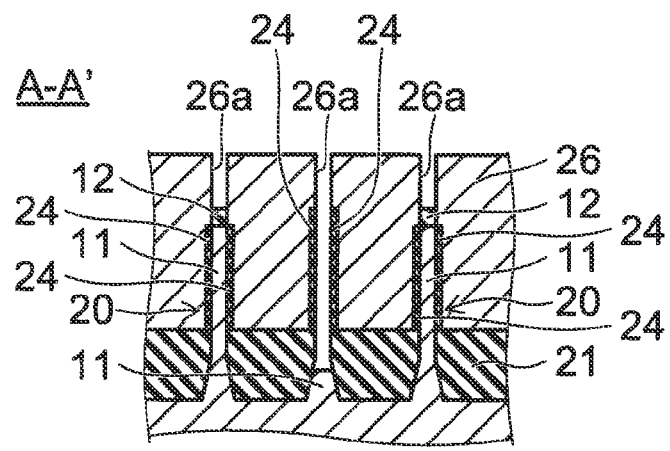
Figure 22C:
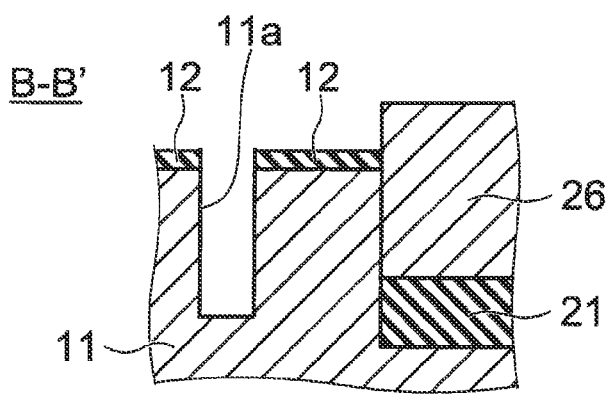

Next, as shown in FIGS. 22A to 22C, by wet etching with fluoro-nitric acid at room temperature or hot treatment with hydrochloric acid (HCl) at a temperature of 550-800° C., the silicon germanium member 13 (see FIGS. 21A to 21C) is removed through the trench 26a.

Figure 23A:
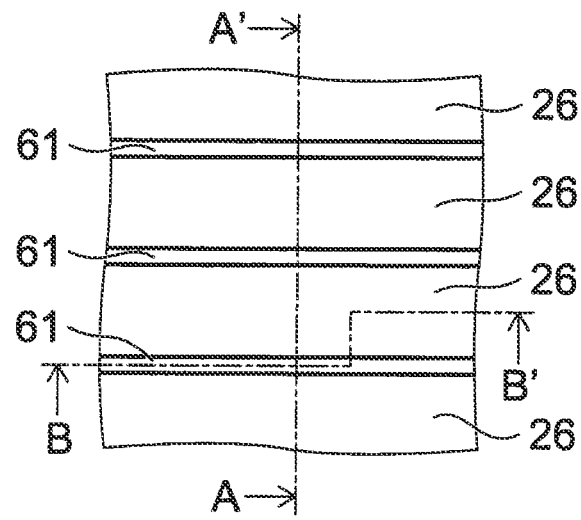
FIGS. 23A to 23C are process views illustrating a method for manufacturing a semiconductor device according to a third embodiment, where
Figure 23B:
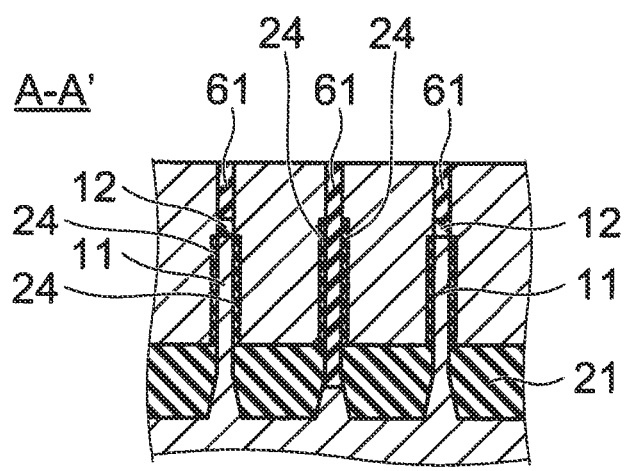
Figure 23C:
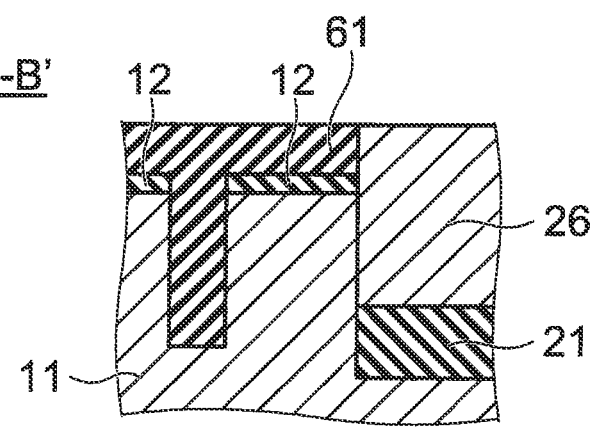

Next, as shown in FIGS. 23A to 23C, an insulating material is deposited on the entire surface. Then, by performing etchback by RIE or performing CMP using the polysilicon film 26 as a stopper, the insulating material deposited on the upper surface of the polysilicon film 26 is removed. Thus, the insulating material is left only inside the trench 26a. Hence, a buried insulating member 61 is placed in the trench 26a.

Figure 24A:
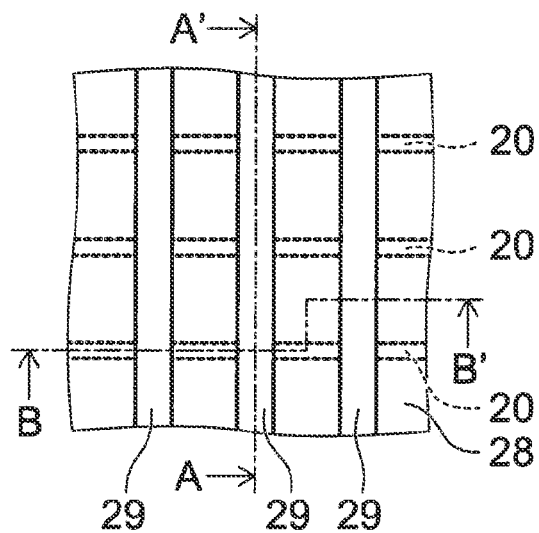
FIGS. 24A to 24C are process views illustrating a method for manufacturing a semiconductor device according to a third embodiment, where
Figure 24B:
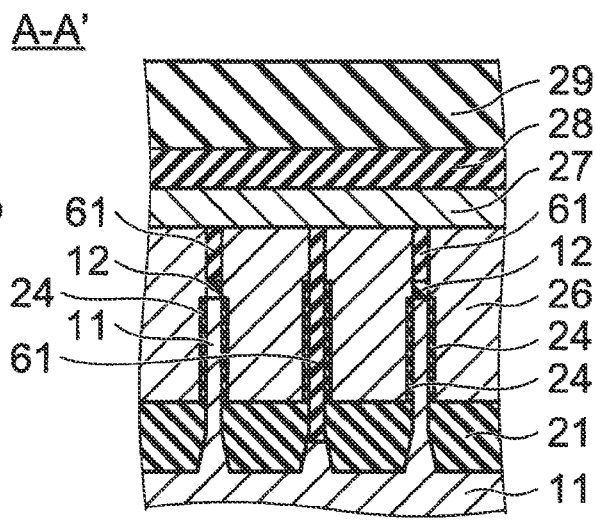
Figure 24C:
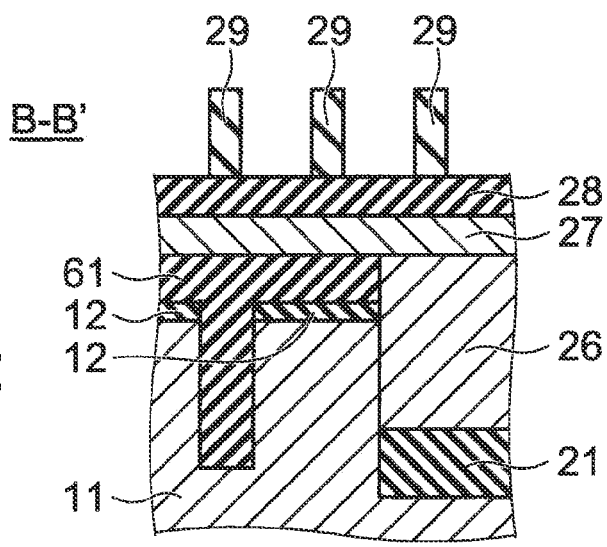

Next, as shown in FIGS. 24A to 24C, a metal film 27 and a silicon nitride film 28 are formed on the polysilicon film 26. Next, a hard mask 29 is formed on the silicon nitride film 28.

Figure 25A:
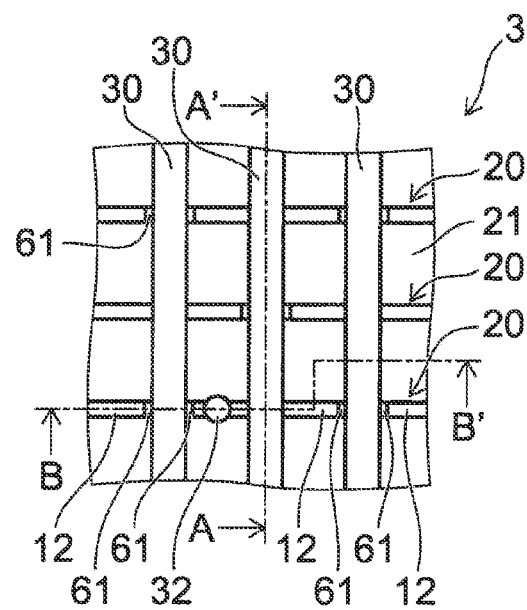
FIGS. 25A to 25C are process views illustrating a method for manufacturing a semiconductor device according to a third embodiment, where
Figure 25B:
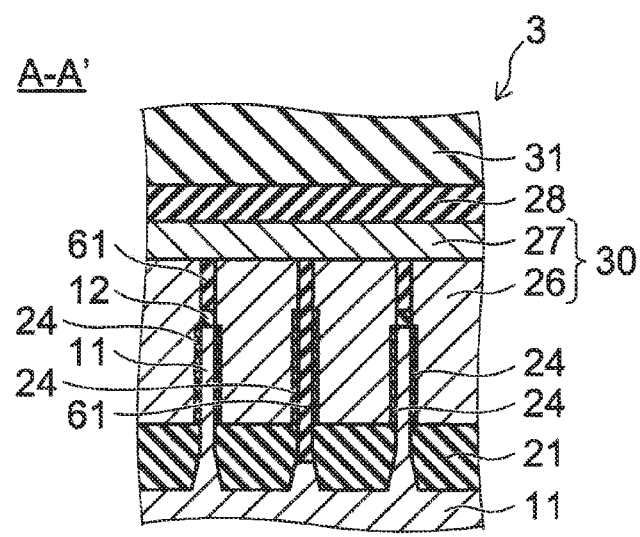
Figure 25C:
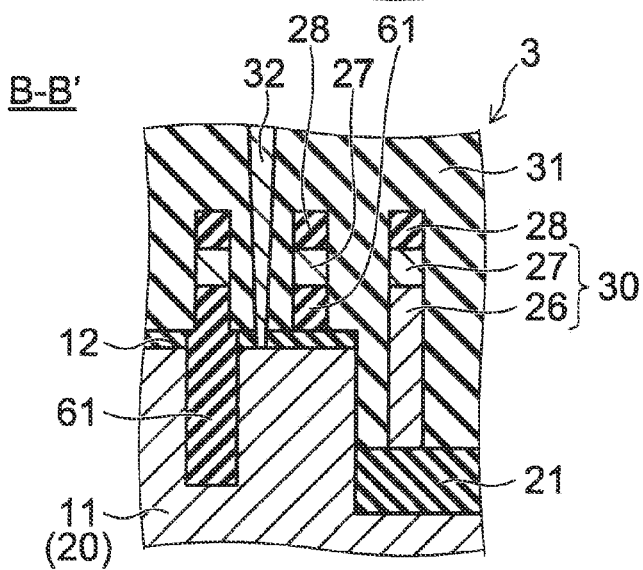

Next, as shown in FIGS. 25A to 25C, the hard mask 29 (see FIGS. 24A to 24C) is used as a mask to perform etching to pattern the silicon nitride film 28, the metal film 27, and the polysilicon film 26. Thus, a gate electrode 30 is formed. Next, the portion of the buried insulating member 61 located outside the immediately underlying region of the gate electrode 30 is removed. Next, the gate electrode 30 is used as a mask to implant impurity to form a FinFET. Next, an interlayer insulating film 31 is formed on the device isolation insulating film 21 so as to cover the gate electrode 30. In the interlayer insulating film 31, contacts 32 are formed so as to be connected to the portion of the fin 20 located between the immediately underlying regions of the gate electrodes 30, i.e., to the source/drain of the FinFET. In FIG. 25A, for convenience of illustration, the silicon nitride film 28 and the interlayer insulating film 31 are omitted, and only one contact 32 is shown. Subsequently, a magnetoresistive effect element is formed. Thus, the semiconductor device 3 according to the embodiment is manufactured.

In the embodiment, in the step shown in FIGS. 20A to 20C, a polysilicon film 26 is formed between the fins 20. Then, in the step shown in FIGS. 21A to 21C, the silicon nitride film 15 is removed. Thus, when the silicon nitride film 15 is removed, the fin 20 can be supported by the polysilicon film 26. Hence, as compared with the above first and second embodiments, the need of the steps for forming and removing a sidewall 23 (see FIGS. 6A to 6C) is eliminated. As a result, the number of steps can be reduced, and the productivity of the semiconductor device can be improved.

In the embodiment, the buried insulating member 61 is left between the fin 20 and the gate electrode 30. This can reduce the parasitic capacitance between the fin 20 and the contact 32.

Furthermore, in the embodiment, when the gate electrode 30 is processed by etching, the upper surface of the fin 20 can be protected not only by the silicon nitride film 15 but also by the buried insulating member 61. This can reduce damage to the fin 20 due to etching.

Moreover, in the embodiment, in the step shown in FIGS. 20A to 20C, the silicon nitride film 15 can be used as a stopper to perform CMP on the polysilicon film 26. Thus, the film thickness of the polysilicon film 26 can be accurately controlled, and the thickness of the gate electrode 30 can be accurately controlled. As a result, the characteristics of the FinFETs can be made uniform.

The manufacturing method, configuration, and effect of the embodiment other than the foregoing are similar to those of the above first embodiment.

In the first and third embodiments described above, as an example, a silicon germanium (Site) member 13 is formed as a sacrificial material. However, the sacrificial material is not limited thereto. Any sacrificial material can be used as long as it has a small selection ratio with respect to the silicon substrate 11 in processing the fin 20, and can be removed selectively with respect to the silicon substrate 11 by appropriate means. For instance, as the sacrificial material, a stacked body of silicon nitride film and silicon film may be used. In this case, the silicon film can be removed by wet etching with an alkaline etching liquid using the silicon nitride film as a stopper.

In the embodiments described above, the semiconductor device is an MRAM as an example. However, the semiconductor device is not limited thereto. The above embodiments are suitably applicable to any devices requiring FinFETs to be arranged with high density.

The embodiments described above can realize a method for manufacturing a semiconductor device in which FinFETs have uniform characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A method for manufacturing a semiconductor device, comprising:
    forming a depression in an upper portion of a semiconductor substrate;
    placing a sacrificial material in the depression;
    forming a plurality of fins extending in one direction and arranged periodically by selectively removing the semiconductor substrate and the sacrificial material;
    forming a device isolation insulating film in a lower portion of space between the fins;
    removing the sacrificial material;
    forming a gate insulating film on an exposed surface of the fin; and
    forming a gate electrode extending in a direction crossing the one direction so as to straddle the fin on the device isolation insulating film.

2. The method according to claim 1, further comprising:
    forming a first film on the semiconductor substrate before the forming a depression;
    forming a second film made of a material different from material of the first film and material of the sacrificial material on the first film and the sacrificial material;
    forming a third film made of a material different from the material of the second film on the second film;
    forming a sidewall made of a material different from any of the material of the first film, the material of the second film, and the material of the third film on a side surface of a stacked body made of the fin, the first film, the second film, and the third film;
    removing the third film; and
    removing the sidewall,
    wherein the forming the plurality of fins includes:
        forming a hard mask on the third film; and patterning the third film, the second film, the first film, the semiconductor substrate, and the sacrificial material by etching using the hard mask as a mask.

3. The method according to claim 2, further comprising:
forming a fourth film on the side surface of the fin; and
removing the fourth film and the second film after the removing the sidewall,
wherein the semiconductor substrate and the sidewall are formed from silicon,
the sacrificial material is formed from silicon germanium,
the device isolation insulating film, the second film, and the fourth film are formed from silicon oxide, and
the first film and the third film are formed from silicon nitride.

4. The method according to claim 1, wherein the forming the device isolation insulating film includes:
depositing an insulating material;
heating the insulating material; and
setting back an upper surface of a film made of the insulating material by etching.

5. The method according to claim 1, wherein the semiconductor device is a magnetoresistive random access memory.

6. A method for manufacturing a semiconductor device, comprising:
forming a depression in an upper portion of a semiconductor substrate;
forming a barrier film on an inner surface of the depression;
placing a sacrificial material in the depression;
forming a plurality of fins extending in one direction and arranged periodically by selectively removing the semiconductor substrate, the barrier film, and the sacrificial material;
forming a device isolation insulating film in a lower portion of space between the fins;
removing the sacrificial material by etching using the barrier film as a stopper;
forming a gate insulating film on an exposed surface of the fin; and
forming a gate electrode extending in a direction crossing the one direction so as to straddle the fin on the device isolation insulating film.

7. The method according to claim 6, further comprising:
forming a first film on the semiconductor substrate before the forming the depression;
forming a second film made of a material different from material of the first film and material of the sacrificial material on the first film and the sacrificial material;
forming a third film made of a material different from the material of the second film on the second film;
forming a sidewall made of a material different from any of the material of the first film, the material of the second film, and the material of the third film on a side surface of a stacked body made of the fin, the first film, the second film, and the third film;
removing the third film; and
removing the sidewall,
wherein the forming the plurality of fins includes:
forming a hard mask on the third film; and
patterning the third film, the second film, the first film, the semiconductor substrate, and the sacrificial material by etching using the hard mask as a mask.

8. The method according to claim 7, further comprising:
forming a fourth film on the side surface of the fin; and
removing the fourth film and the second film after the removing the sidewall,
wherein the sidewall is formed on the fourth film,
the semiconductor substrate, the sacrificial material, and the sidewall are formed from silicon,
the device isolation insulating film, the second film, and the fourth film are formed from silicon oxide, and
the barrier film, the first film, and the third film are formed from silicon nitride.

9. The method according to claim 6, wherein the forming the device isolation insulating film includes:
depositing an insulating material;
heating the insulating material; and
setting back an upper surface of a film made of the insulating material by etching.

10. The method according to claim 6, wherein the semiconductor device is a magnetoresistive random access memory.

11. A method for manufacturing a semiconductor device, comprising:
forming a depression in an upper portion of a semiconductor substrate;
placing a sacrificial material in the depression;
forming a plurality of fins extending in one direction and arranged periodically by selectively removing the semiconductor substrate and the sacrificial material;
forming a device isolation insulating film in a lower portion of space between the fins;
forming a gate insulating film on an exposed surface of the fin;
forming a first conductive film so as to cover the fin on the device isolation insulating film;
exposing the sacrificial material at an upper surface of the first conductive film;
removing the sacrificial material;
forming a second conductive film on the first conductive film; and
forming a gate electrode extending in a direction crossing the one direction by selectively removing the second conductive film and the first conductive film.

12. The method according to claim 11, further comprising:
forming a first film on the semiconductor substrate before the forming the depression;
forming a second film made of a material different from material of the first film and material of the sacrificial material on the first film and the sacrificial material;
forming a third film made of a material different from the material of the second film on the second film; and
burying an insulating member in a trench formed by removal of the third film, the second film, and the sacrificial material in the first conductive film,
wherein the exposing the sacrificial material includes:
exposing the third film at the upper surface of the first conductive film by performing planarization treatment on the first conductive film using the third film as a stopper;
removing the third film; and
removing the second film.

13. The method according to claim 12, wherein
the semiconductor substrate and the first conductive film are formed from silicon,
the sacrificial material is formed from silicon germanium,
the device isolation insulating film, the gate insulating film, and the second film are formed from silicon oxide, and
the first film and the third film are formed from silicon nitride.

14. The method according to claim 11, wherein the forming the device isolation insulating film includes:
depositing an insulating material;
heating the insulating material; and setting back an upper surface of a film made of the insulating material by etching.

15. The method according to claim 11, wherein the semiconductor device is a magnetoresistive random access memory.

* * * * *